United States Patent
Teh

(10) Patent No.: US 8,558,595 B2
(45) Date of Patent: Oct. 15, 2013

(54) SEMICONDUCTOR INTEGRATED CIRCUIT DEVICE

(71) Applicant: Kabushiki Kaisha Toshiba, Minato-ku (JP)

(72) Inventor: Chen Kong Teh, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/767,694

(22) Filed: Feb. 14, 2013

(65) Prior Publication Data

US 2013/0162323 A1 Jun. 27, 2013

Related U.S. Application Data

(63) Continuation of application No. 11/762,441, filed on Jun. 13, 2007, now Pat. No. 8,395,431.

(30) Foreign Application Priority Data

Jun. 19, 2006 (JP) ................................. 2006-169364

(51) Int. Cl.
*H03K 3/00* (2006.01)
(52) U.S. Cl.
USPC .......................................... 327/218; 327/212
(58) Field of Classification Search
USPC ........ 327/212, 215, 217–219; 326/68, 83, 95, 326/96, 98
See application file for complete search history.

(56) References Cited

U.S. PATENT DOCUMENTS

| 4,631,420 A | 12/1986 | Hollis et al. |
| 5,764,089 A * | 6/1998 | Partovi et al. ................. 327/200 |
| 6,633,188 B1 | 10/2003 | Jia et al. |
| 2004/0095179 A1 | 5/2004 | Eliason |

FOREIGN PATENT DOCUMENTS

| JP | 63-18814 | 1/1988 |
| JP | 63-103512 | 5/1988 |
| JP | 64-24504 | 1/1989 |
| JP | 03-272216 | 12/1991 |
| JP | 6-104701 | 4/1994 |
| JP | 06260902 A | 9/1994 |
| JP | 7-283698 | 10/1995 |
| JP | 10-242810 | 9/1998 |
| JP | 10-512112 | 11/1998 |
| JP | 2002-084167 | 3/2002 |

OTHER PUBLICATIONS

Office Action issued Sep. 6, 2011 in Japanese Application No. 2006-169364 filed Jun. 19, 2006.
Toshio Yuyama, "The design of the digital IC Circuit", Jan. 10, 1987, CO Publishing Co., Ltd., pp. 41-47.
Japanese Office Action issued Jun. 26, 2012 in Patent Application No. 2006-169364 with English Translation.

* cited by examiner

*Primary Examiner* — Lincoln Donovan
*Assistant Examiner* — Diana J Cheng
(74) *Attorney, Agent, or Firm* — Oblon, Spivak, McClelland, Maier & Neustadt, L.L.P.

(57) ABSTRACT

In a clear period, transistors NT38 and PT38 turn on and state retention nodes HQ and H/Q are cleared to an L level and an H level, respectively. In this clear period, a transistor NT21 is off. Consequently, a precharge node PS maintains itself at an H level. Thus, transistors PT31 and NT32 are off, thereby preventing a short circuit from occurring in a clear period. A short circuit is also prevented from occurring in a preset period.

14 Claims, 25 Drawing Sheets

SEMICONDUCTOR INTEGRATED CIRCUIT DEVICE

CROSS-REFERENCE TO RELATED APPLICATION

This application is a continuation of and claims the benefit of priority under 35 U.S.C. §120 from U.S. Ser. No. 11/762,441 filed Jun. 13, 2007, and claims the benefit of priority under 35 U.S.C. §119 from Japanese Patent Application No. 2006-169364 filed Jun. 19, 2006; the entire contents of each of which are incorporated herein by reference.

BACKGROUND OF THE INVENTION

1. Field of the Invention

The present invention relates to a semiconductor integrated circuit device and, more particularly, to a semiconductor integrated circuit device having a flip-flop circuit or circuits.

2. Description of Related Art

Conventionally, flip-flop circuits have been widely used in integrated circuits, such as LSI devices. Flip-flop circuits are classified into those of synchronous type and those of asynchronous type. A synchronous flip-flop circuit changes the output thereof in synchronization with a clock input. Synchronous flip-flop circuits include circuits of various types, such as a master-slave flip-flop circuit and a pulse-triggered flip-flop circuit.

Incidentally, as functions required of a synchronous flip-flop circuit, there are asynchronous clear and preset functions. These functions are intended to forcibly clear and preset the output node of a flip-flop circuit (hereinafter also referred to as a state retention node).

In a flip-flop circuit of master-slave type, clear and preset functions can be easily realized by adding a pull-down circuit or a pull-up circuit to the output node, as described in Japanese Patent Application Laid-Open No. 6-260902.

On the other hand, a flip-flop circuit of pulse-triggered type changes the output thereof only in a narrow pulse duration synchronized with a clock input. Conceivably, a pull-down circuit or a pull-up circuit may be added to the output node of such a pulse-triggered flip-flop circuit to clear or preset the output node.

In this case, however, a short circuit can occur in the output node depending on the state of input data. For this reason, in a pulse-triggered flip-flop circuit, it has been impossible to provide clear and preset functions by the same means as used in a master-slave flip-flop circuit.

It should be noted that the term "pulse-triggered flip-flop" as used herein refers to a flip-flop capable of changing the output thereof only in a relatively narrow pulse duration synchronized with a clock input.

SUMMARY OF THE INVENTION

According to one aspect of the present invention, a semiconductor integrated circuit device provided with a pulse-triggered flip-flop configured to allow the level of a state retention node to transit in a transition period and have the level of the state retention node retained in a transition-forbidden period, thereby setting the state retention node to a level based on input data inputted to a data input node, includes: a clear portion configured to forcibly clear the state retention node according to a clear signal; and a logic circuit configured to provide the result of a logical operation performed between input data and the clear signal to the data input node as the input data.

According to another aspect of the present invention, a semiconductor integrated circuit device provided with a pulse-triggered flip-flop configured to allow the level of a state retention node to transit in a transition period and have the level of the state retention node retained in a transition-forbidden period, thereby setting the state retention node to a level based on input data inputted to a data input node, includes: a preset portion configured to forcibly preset the state retention node according to a preset signal; and a logic circuit configured to provide the result of a logical operation performed between input data and the preset signal to the data input node as the input data.

According to still another aspect of the present invention, a semiconductor integrated circuit device provided with a pulse-triggered flip-flop configured to allow the level of a state retention node to transit in a transition period and have the level of the state retention node retained in a transition-forbidden period, thereby setting the state retention node to a level based on input data inputted to a data input node and a data input inverting node, includes: a clear portion configured to forcibly clear the state retention node according to a clear signal; a preset portion configured to forcibly preset the state retention node according to a preset signal; a first logic circuit configured to provide the result of a logical operation performed between input data and the clear signal to either one of the data input node and the data input inverting node as the input data; and a second logic circuit configured to provide the result of a logical operation performed between input data and the preset signal to the other one of the data input node and the data input inverting node as the input data.

DETAILED DESCRIPTION OF THE PREFERRED EMBODIMENTS

The preferred embodiments of the present invention are described in detail hereinafter with reference to the accompanying drawings.

<First Embodiment (Addition of Clear Function)>

Figure 1:
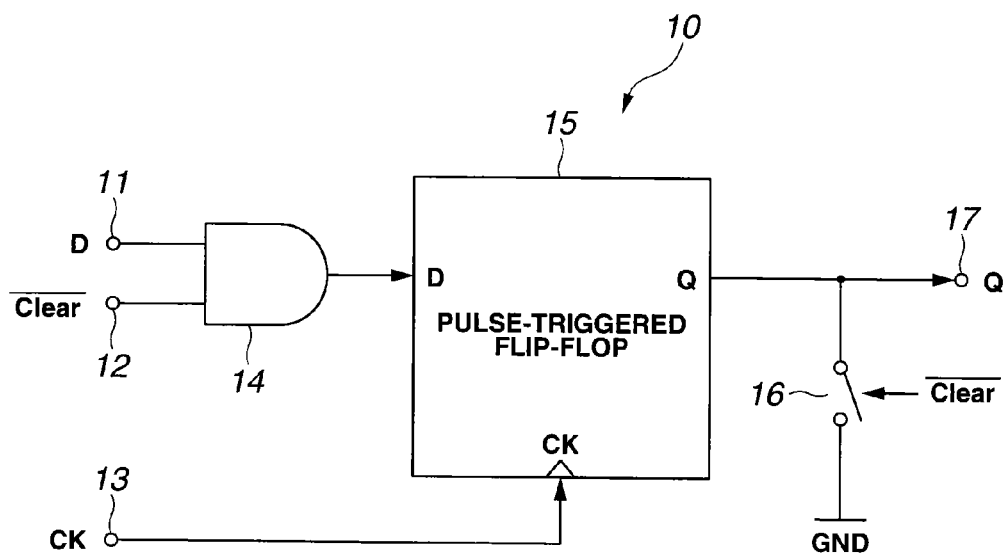
FIG. 1 pertains to a semiconductor integrated circuit device in accordance with the first embodiment of the present invention and is a circuit diagram illustrating a flip-flop circuit.

FIG. 1 pertains to a semiconductor integrated circuit device in accordance with the first embodiment of the present invention and is a circuit diagram illustrating a flip-flop circuit.

A flip-flop circuit 10 is configured with an AND circuit 14 serving as a control portion, a pulse-triggered flip-flop (hereinafter referred to as an FF) 15, and a switch 16 serving as a pull-down circuit. Data D is provided to a data input terminal 11 of the flip-flop circuit 10. A clock CK is inputted to a clock input terminal 13. In the present embodiment, the inverted signal/Clear (hereinafter in this specification, a bar above each symbol in the drawings is represented by a slash mark placed in front of the symbol in the text of this specification in order to signify the inverted signal of a signal denoted by the symbol) of a clear signal Clear is inputted to a clear input terminal 12. The data D and the inverted clear signal/Clear are provided to an AND circuit 14. The output of the AND circuit 14 is supplied to the data input node D of the FF 15.

When a clock CK from the clock input terminal 13 is provide to a control node CK, the FF 15 sets a narrow pulse duration (hereinafter referred to as a transition period) synchronized with the clock CK. In a short transition period, the FF 15 enables updating of the Q output of an output node (state retention node) Q. The FF 15 updates the Q output of the state retention node Q according to data D supplied to the data input node D and according to the Q output of the state retention node Q.

The output node Q is connected to a low-level (hereinafter referred to as an L-level) ground potential GND through the switch 16. The switch 16 is turned on by an L-level inverted clear signal/Clear to cause the output node Q to transit to an L level.

Table 1 below shows the truth table of the flip-flop circuit 10 illustrated in FIG. 1.

TABLE 1

| D | /Clear | PCK | Qn + 1 |
|---|---|---|---|
| X | L | X | L |
| L | H | rise | L |
| H | H | rise | H |
| X | H | fall | Qn |

In the truth table shown in Table 1, the column D represents whether data D inputted to the data input node D is at a high level (hereinafter referred to as an H level) or an L level, the/Clear column represents whether an inverted clear signal /Clear is at an H level or an L level, the PCK column represents whether the period in question is a transition period (rise) or not (fall), and the Qn+1 column represents an output after the output node Q is updated. Note that Qn denotes an output before the output node Q is updated and X denotes that there is no need for specification.

(FF Having Pulse Generator Portion and RS Latch Portion)

Figure 2:
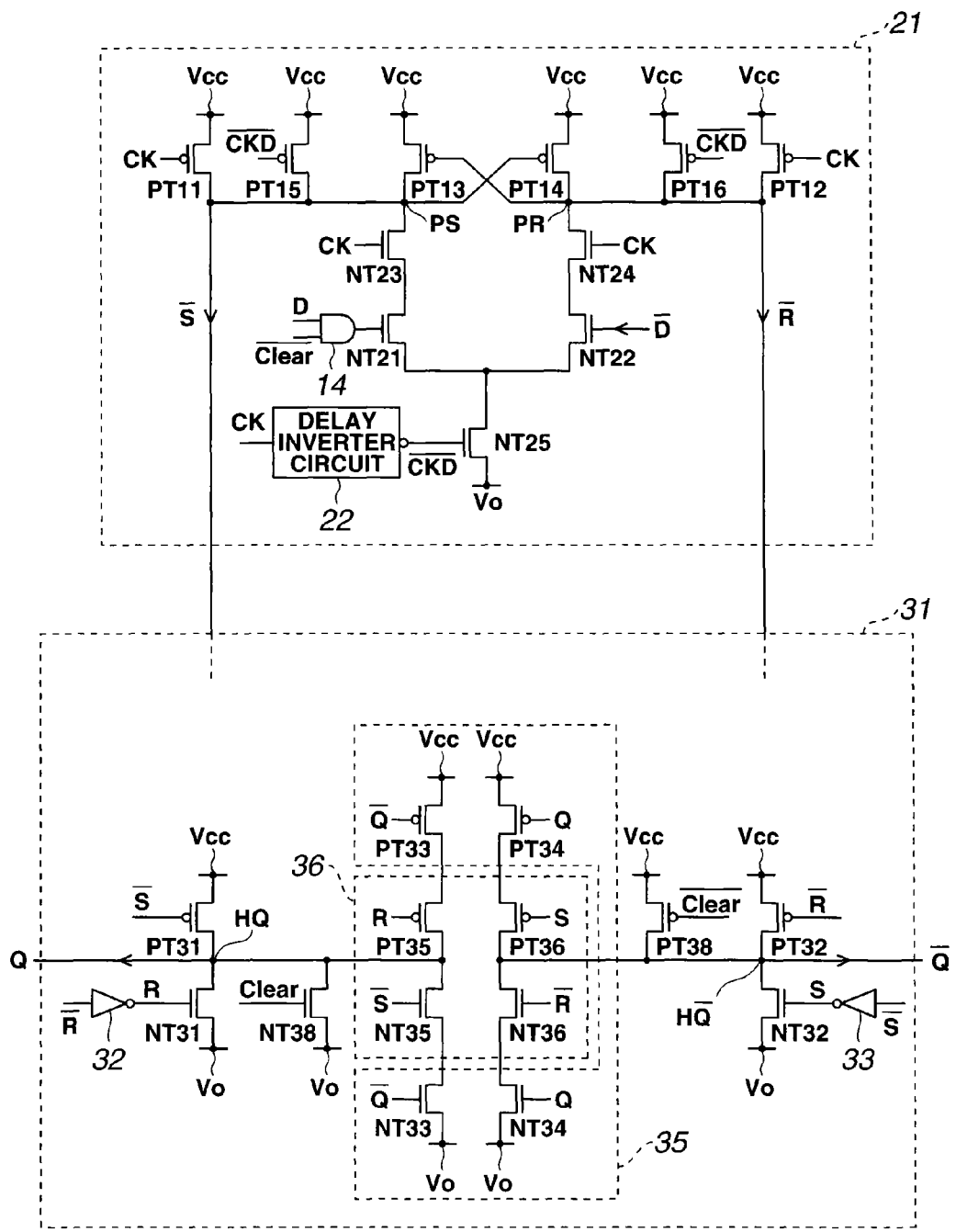
FIG. 2 is a circuit diagram illustrating a specific configuration of the flip-flop circuit shown in FIG. 1.

FIG. 2 is a circuit diagram illustrating a specific configuration of the flip-flop circuit shown in FIG. 1.

FIG. 2 illustrates an example wherein a flip-flop configured with a pulse generator portion 21 and an RS latch portion 31 is employed as the FF 15. Note that in each figure, wire lines configured to supply signals to the gates of respective transistors are not illustrated for simplification of the drawings.

Note also that although an example is shown wherein the AND circuit 14 is built in the pulse generator portion 21 configuring the FF 15, the AND circuit may be configured external to the FF 15, as illustrated in FIG. 1. Note further that in FIG. 2, a configuration is shown wherein the pulse generator portion 21 has a data inverting input node/D whereto the inverted signal/D of the data D is inputted, in addition to the data input node D whereto the data D is inputted, another configuration is possible wherein the pulse generator portion 21 has either one of the nodes as illustrated in FIG. 1.

<Pulse Generator Portion>

In FIG. 2, data D and inverted data/D are respectively supplied to the gates of N-type transistors NT21 and NT22 in a differential configuration. Note that the inverted data/D may be generated within the pulse generator portion 21, or the inverted data/D may be generated externally by inverting the data D and then supplied to the pulse generator portion 21.

The pulse generator portion 21 generates pulses/S and/R based on the data D and/D. The pulses/S and/R are respectively generated by changes in the levels of precharge nodes PS and PR within the pulse generator portion 21.

The precharge node PS is connected to a power supply terminal Vcc through the source-drain paths of P-type transistors PT11, PT15 and PT13. In addition, the precharge node PR is connected to the power supply terminal Vcc through the source-drain paths of P-type transistors PT12, PT16 and PT14.

A clock CK is supplied to the gates of the transistors PT11 and PT12 and an inverted clock/CKD is supplied to the gates of the transistors PT15 and PT16. The inverted clock/CKD is generated by delaying and inverting the clock CK with a delay inverter circuit 22 built in the pulse generator portion 21. The precharge node PS is connected to the gate of the transistor PT14 and the precharge node PR is connected to the gate of the transistor PT13.

The precharge node PS is connected to one discharging path, in which the source-drain paths of N-type transistors NT23 and NT21 are connected in series. Likewise, the precharge node PR is connected to the other discharging path, in which the source-drain paths of N-type transistors NT24 and NT22 are connected in series. The drains of the transistors NT21 and NT22 are connected in common to each other, and the point of this common connection is connected to a reference potential terminal Vo through the source-drain path of an N-type transistor NT25.

Figure 3:
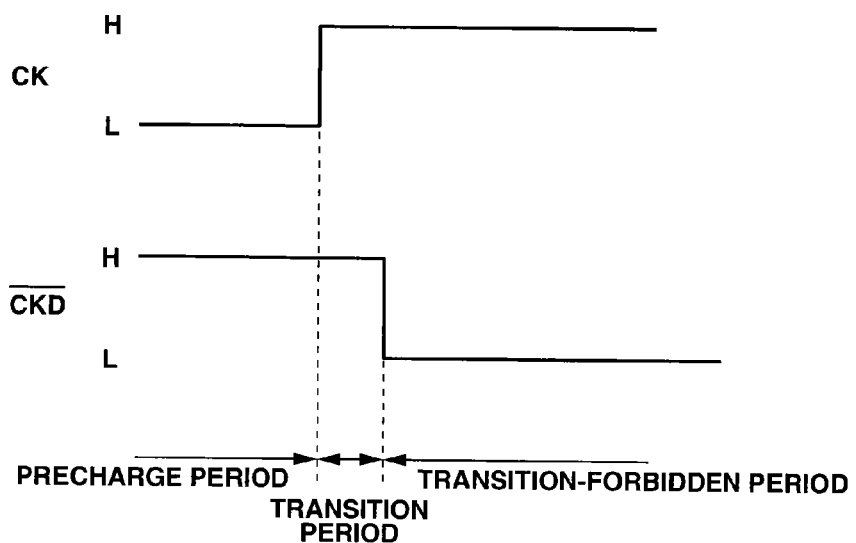
FIG. 3 is a timing chart intended to explain the operation of the first embodiment.

The precharge nodes PS and PR of the pulse generator portion 21 are set at levels appropriate for a precharge period, a transition period and a transition-forbidden period (see FIG. 3). Before the state retention node of an RS latch portion 31, which is explained later, makes a state transition, a precharge period is set up. In this period, the clock CK is at an L level and the transistors PT11 and PT12 are on. Consequently, both the precharge nodes PS and PR are set to an H level.

In a precharge period, the inverted clock/CKD is at an H level. When the precharge period ends and the clock CK changes to an H level, the inverted clock /CKD changes from an H level to an L level after the delay time provided by the delay inverter circuit 22. The period from when the clock CK changes to an H level to when the inverted clock/CKD changes to an L level is a transition period. In this transition period, all of the transistors PT11, PT12, PT15 and PT16 configured to charge the precharge nodes PS and PR are off and the levels of the precharge nodes PS and PR are determined by the states of one and the other discharging paths.

In a transition period, all of the transistors NT23 to NT25 are on. If the data D is at an H level (i.e., the inverted data/D is at an L level) and the inverted clear signal/Clear is also at an H level, the transistor NT22 is off and the transistor NT21 is on, wherein the precharge node PS is discharged through one discharging path to internally transit to an L level. Conversely, if the data D is at an L level, the transistor NT21 is off and the transistor NT22 is on, wherein the precharge node PR is discharged through the other discharging path to internally transit to an L level.

When one of the precharge nodes PS and PR goes to an L level, one of the transistors PT13 and PT14 turns on, thus charging the other one of the precharge nodes PS and PR. In this way, when the data D is at an H level, the precharge node PS goes to an L level and the precharge node PR goes to an H level. In contrast, when the data D is at an L level, the precharge node PS goes to an H level and the precharge node PR goes to an L level.

When the inverted clock/CKD goes to an L level causing a transition period to end and a transition-forbidden period to occur, the transistor NT25 turns off to cut off both the one and the other discharging paths. On the other hand, the transistors PT15 and PT16 turn on to charge the precharge nodes PS and PR. More specifically, one of pulses/S and/R respectively arising at the precharge nodes PS and PR goes to an L level during a transition period according to the data D and/D and remains at an H level during other periods.

<RS Latch Portion>

The pulses/S and/R are supplied to the RS latch portion 31. In the RS latch portion 31, there are configured a first state transition portion composed of a P-type transistor PT31, an N-type transistor NT31 and an inverter 32 and a second state transition portion composed of a P-type transistor PT32, an N-type transistor NT32 and an inverter 33. The transistor PT31 is configured in the first charging path and the N-type transistor NT31 is configured in the first discharging path. A first switching portion designed to control the first charging and discharging paths is configured with the transistors NT21, NT22, PT31, NT31, PT32, NT32, etc. In addition, a second switching portion designed to control the first switching portion is configured with the transistors NT23, NT24, NT25, etc.

The first state transition portion is configured by connecting in series the source-drain paths of the transistors PT31 and NT31 between the power supply terminal Vcc and the reference potential terminal Vo. The inverter 32 generates the pulse R by inverting the pulse/R and provides the pulse R to the gate of the transistor NT31. The pulse/S is supplied to the gate of the transistor PT31. On the other hand, the second state transition portion is configured by connecting in series the source-drain paths of the transistors PT32 and NT32 between the power supply terminal Vcc and the reference potential terminal Vo. The inverter 33 generates the pulse S by inverting the pulse/S and provides the pulse S to the gate of the transistor NT32. The pulse/R is supplied to the gate of the transistor PT32.

A state retention node (output node) HQ (corresponding to the output node Q shown in FIG. 1) is configured with the connection point at which the transistors PT31 and NT31 are connected to each other. Likewise, a state retention node (output node) H/Q is configured by the connection point at which the transistors PT32 and NT32 are connected to each other.

The source-drain paths of a P-type transistor PT33, a P-type transistor PT35, an N-type transistor NT35, and an N-type transistor NT33 are connected in series between the power supply terminal Vcc and the reference potential terminal Vo. The pulses/Q, R,/S and/Q are respectively supplied to the gates of these transistors PT33, PT35, NT35 and NT33.

Likewise, the source-drain paths of a P-type transistor PT34, a P-type transistor PT36, an N-type transistor NT36, and an N-type transistor NT34 are connected in series between the power supply terminal Vcc and the reference potential terminal Vo. The pulses Q, S,/R and Q are respectively supplied to the gates of these transistors PT34, PT36, NT36 and NT34.

A retention portion 35 is configured with the transistors PT33, PT34, NT33 and NT34. A retention control portion 36 is configured with the transistors PT35, PT36, NT35 and NT36. The connection point at which the transistors PT35 and NT35 configuring the retention control portion 36 are connected to each other is connected to the state retention node HQ. Likewise, the connection point at which the transistors PT36 and NT36 are connected to each other is connected to the state retention node H/Q. The level of the state retention node HQ is outputted as a Q output and the level of the state retention node H/Q is outputted as a/Q output. Note that either the Q output or the/Q output only may be outputted as illustrated in FIG. 1.

In the present embodiment, the source-drain path of an N-type transistor NT38 is connected between the state retention node HQ and the reference potential terminal Vo. The clear signal Clear is supplied to the gate of the transistor NT38. In addition, the source-drain path of a P-type transistor PT38 is connected between the state retention node H/Q and the power supply terminal Vcc. The inverted clear signal/Clear is supplied to the gate of the transistor PT38.

When the pulses/S and/R are at an H level, the transistors PT31, PT32, NT31 and NT32 of the first and second state transition portions are off and, therefore, the levels of the state retention nodes HQ and H/Q do not change. In other words, the Q and/Q outputs do not change in a precharge period and in a transition-forbidden period.

In a transition period, the levels of the state retention nodes HQ and H/Q are determined according to the states of the pulses/S and/R. For example, if the pulse /S is at an L level and the pulse/R is at an H level, the transistors PT31 and NT32 are on and the transistors NT31 and PT32 are off, causing the state retention node HQ to go to an H level and the state retention node H/Q to go to an L level. Conversely, if the pulse/S is at an H level and the pulse/R is at an L level, the transistors PT31 and NT32 are off and the transistors NT31 and PT32 are on, causing the state retention node HQ to go to an L level and the state retention node H/Q to go to an H level.

The transistors PT33 and NT33 configuring the retention portion 35 can configure an inverter which outputs the Q output to the state retention node HQ when the gates of the transistors are provided with the/Q output. Likewise, the transistors PT34 and NT34 can configure an inverter which outputs the/Q output to the state retention node H/Q when the gates of the transistors are provided with the Q output. In other words, two inverters whereto each other's outputs are inputted are configured and the states of the state retention nodes HQ and H/Q can be retained using these inverters.

The transistors PT35, PT36, NT35 and NT36 configuring the retention control portion 36 are all on when the pulses/S and/R at an H level. In this case, the above-described two inverters are configured in the retention portion 35 and the states of the state retention nodes HQ and H/Q are retained. In other words, the levels of the state retention nodes HQ and H/Q are maintained and do not change in a precharge period and in a transition-forbidden period.

In a transition period, if the pulse/S is at an L level and the pulse/R is at an H level, the transistors PT35 and NT36 are on and the transistors NT35 and PT36 are off, causing the state retention node HQ to go to an H level and the state retention node H/Q to go to an L level. Conversely, if the pulse/S is at an H level and the pulse/R is at an L level, the transistors PT35 and NT36 are off and the transistors NT35 and PT36 are on, causing the state retention node H/Q to go to an H level and the state retention node HQ to go to an L level.

In the present embodiment, if the clear signal Clear is at an L level (i.e., the inverted clear signal/Clear is at an H level), the state retention nodes HQ and H/Q are not affected by the clear signal Clear (inverted clear signal/Clear). However, if the clear signal Clear is at an H level (i.e., the inverted clear signal/Clear is at an L level), the state retention node HQ transits to an L level and the state retention node H/Q transits to an H level. In other words, the Q output (/Q output) can be cleared by setting the clear signal Clear to an H level (i.e., the inverted clear signal/Clear to an L level).

As described above, both the pulse/S and the pulse/R are at an H level and the first and second state transition portions are in a disabled state in a precharge period and in a transition-forbidden period. In a transition period, however, one of the pulses/S and/R internally transits to an L level. If the pulse/S internally transits to an L level in a period wherein the clear signal Clear for clearing the Q output is at an H level, the transistors PT31 and NT38 turn on simultaneously, causing the power supply terminal Vcc and the reference potential terminal Vo to fall into a short-circuited state. The same holds true for the transistors NT32 and PT38.

For this reason, the Q and/Q outputs cannot be cleared simply by providing charging and discharging paths for clearing purposes in the state retention nodes HQ and H/Q. Hence, in the present embodiment, an AND circuit 14 is provided on the pulse generator portion side.

The inverted clear signal/Clear is supplied to the AND circuit 14. In other words, the output of the AND circuit 14 goes to an L level when the inverted clear signal/Clear is at an L level, i.e., the clear signal Clear is at an H level. Consequently, even if the data D is at an H level, the transistor NT21 remains off and the precharge node PS maintains itself at an H level. This means that in a clear period wherein the clear signal Clear is at an H level, the pulse/S is always at an H level. Accordingly, the transistor PT31 is always off in a clear period. It is therefore possible to set the state retention node HQ to an H level without causing any short circuits. The same holds true for the state retention node H/Q.

Next, an explanation will be made of the operation of the embodiment configured as described above with reference to the timing chart shown in FIG. 3 and the truth table shown in Table 1. FIG. 3 shows a clock CK and an inverted clock /CKD.

Now, assume that the clear signal Clear is at an L level, i.e., the inverted clear signal/Clear is at an H level. In this case, a normal operation takes place. That is, the clock CK is assumed to be at an L level. As illustrated in FIG. 3, a precharge period is set up when the clock CK is at an L level. In this period, the one and the other discharging paths of the pulse generator portion 21 are cut off. Thus, the precharge nodes PS and PR are set to an H level when the transistors PT11 and PT12 turn on.

Also in this period, the transistors PT31, PT32, NT31 and NT32 configuring the first and second transition portions of the RS latch portion 31 are off and the levels of the state retention nodes HQ and H/Q are not changed by the first and second transition portions. Also in this period, the transistors PT35, PT36, NT35 and NT36 of the retention control portion 36 are on and the levels of the state retention nodes HQ and H/Q are retained by the transistors PT33, PT34, NT33 and NT34 configuring the retention portion 35.

Here, assume that the clock CK changes from an L level to an H level. The clock CK is delayed by the delay inverter circuit 22. The output of the delay inverter circuit 22 is inverted and the inverted clock/CKD shown in FIG. 3 is supplied to the gate of the transistor NT25. The period wherein both the clock CK and the inverted clock/CKD are at an H level is a transition period.

When a transition period occurs, the transistors NT23 to NT25 turn on, while the transistors PT11, PT12, PT15 and PT16 are off. Since the data D is at an L level in this case, the other discharging path goes to a conducting state and the precharge node PR internally transits from an H level to an L level. In other words, the pulse/S remains at an H level and the pulse/R changes to an L level.

As a result, the transistors PT31 and NT32 of the first and second transition portions in the RS latch portion 31 turn off and the transistors NT31 and PT32 thereof turn on, causing the state retention node HQ to go to an L level and the state retention node H/Q to go to an H level. In this way, the Q output goes to an L level and the/Q output goes to an H level upon input of L-level data D, as shown in the truth table.

Then, a transition to a transition-forbidden period takes place when the inverted clock/CKD changes to an L level. In this case, the transistors PT15 and PT16 of the pulse generator portion 21 turn on, setting the precharge nodes PS and PR to an H level. This causes the pulses/S and/R to go to an H level.

Consequently, the transistors PT31, PT32, NT31 and NT32 configuring the first and second transition portions are off also in a transition-forbidden period. Thus, the levels of the state retention nodes HQ and H/Q are not changed by the first and second transition portions.

In this period, the transistors PT35, PT36, NT35 and NT36 of the retention control portion 36 are on and the levels of the state retention nodes HQ and H/Q are retained. In this way, the previous Q and/Q outputs are retained in periods other than a transition period irrespective of the level of data D, as indicated by the symbol "fall" in the PCK column of the truth table.

Next, assume that H-level data D is inputted. Then, the transistor NT21 turns on and the transistor NT22 turns off. In a transition period, the transistor NT25 turns on and the transistors PT11, PT12, PT15 and PT16 turn off, causing the precharge node PS to internally transit to an L level. In other words, the pulse/S goes to an L level and the pulse/R goes to an H level.

As a result, the transistors PT31 and NT32 of the first and second transition portions in the RS latch portion 31 turn on and the transistors NT31 and PT32 thereof turn off, causing the state retention node H/Q to go to an L level and the state retention node HQ to go to an H level. In this way, the Q output goes to an H level and the/Q output goes to an L level upon input of H-level data D, as shown in the truth table.

Here, assume that the Q and/Q outputs are cleared. Then, the clear signal Clear goes to an H level (i.e., the inverted clear signal/Clear goes to an L level). In this case, the transistor NT21 of the pulse generator portion 21 is off and the precharge node PS always remains at an H level. Consequently, the transistors PT31 and NT32 of the RS latch portion 31 are off. In addition, the transistors NT38 and PT38 turn on to set the precharge node HQ to an L level and the precharge node H/Q to an H level. In this way, the Q output is cleared to an L level and the/Q output is cleared to an H level.

Note that the pulse/R may go to an L level in a clear period depending on the state of the data D. Even in this case, only the transistors NT31 and PT32 of the RS latch portion 31 turn on, while the transistors PT31 and NT32 are off. Thus, the power supply terminal Vcc and the reference potential terminal Vo are never short-circuited to each other.

As described above, in the present embodiment, the charging and discharging paths configured to turn on according to clear signals are provided in the output nodes (state retention nodes) of the pulse-triggered flip-flop and data is provided to the data input node of the flip-flop through the AND circuit the gate of which opens and closes according to a clear signal, thus making it possible to securely clear the Q output.

<First Example of Modification>

Figure 4:
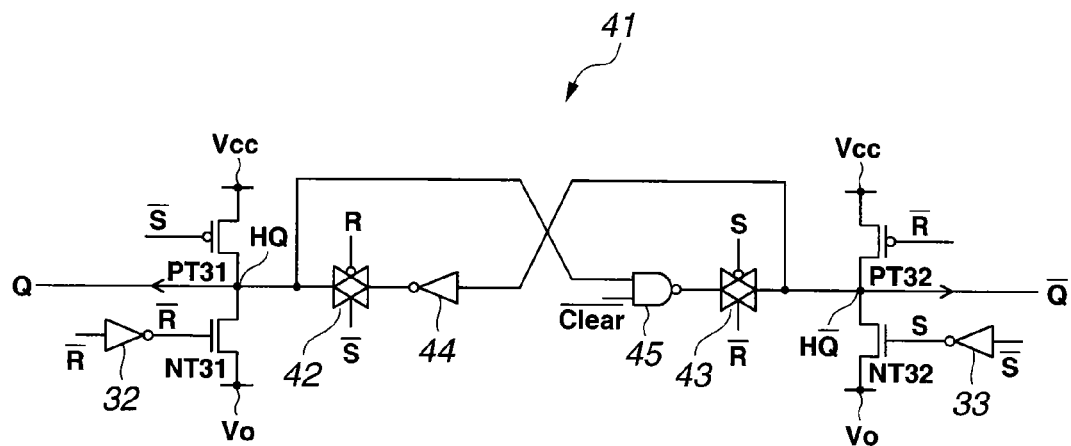
FIG. 4 is a circuit diagram illustrating a first example of modification of the first embodiment.

FIG. 4 is a circuit diagram illustrating a first example of modification of the first embodiment. FIG. 4 illustrates an example of modification of the RS latch portion, wherein the RS latch portion 41 shown in FIG. 4 can be employed in place of the RS latch portion 31 shown in FIG. 2.

The RS latch portion 41 illustrated in FIG. 4 differs from the RS latch portion 31 shown in FIG. 2 in that transfer gates 42 and 43, an inverter 44, and a NAND circuit 45 are employed in place of the retention portion 35 and the retention control portion 36.

The state retention node HQ is connected to the output end of the transfer gate 42 and the state retention node H/Q is connected to the output end of the transfer gate 43. The state retention node H/Q is also connected to the input end of the inverter 44 and the/Q output is inverted by the inverter 44 and is supplied to the input end of the transfer gate 42. In addition, the state retention node HQ is connected to one input end of the NAND circuit 45 and the inverted clear signal/Clear is supplied to the other input end of the NAND circuit 45. The NAND circuit 45 supplies the result of a two-input NAND operation to the input end of the transfer gate 43.

The transfer gate 42, wherein a pulse R is supplied to the inverting control end thereof and a pulse/S is supplied to the control end thereof, outputs the signal of the input end thereof from the output end thereof in response to an L-level pulse R and an H-level pulse/S. Likewise, the transfer gate 43, wherein a pulse S is supplied to the inverting control end thereof and a pulse/R is supplied to the control end thereof, outputs the signal of the input end thereof from the output end thereof in response to an L-level pulse S and an H-level pulse/R. The retention control portion is configured with these transfer gates 42 and 43 and the retention portion is configured with the inverter 44 and the NAND circuit 45.

In the RS latch portion 41 configured as described above, the operations of the first and second transition portions are the same as those of the RS latch portion 31 shown in FIG. 2. When the inverted clear signal/Clear is at an H level, the NAND circuit 45 is equivalent to an inverter that invertedly outputs the input thereof. In other words, two inverters whereto each other's outputs are inputted are configured with the inverter 44 and the NAND circuit 45. With these inverters, it is possible to retain the states of the state retention nodes HQ and H/Q.

In a precharge period and a transition-forbidden period, the pulses/S and/R are at an H level. Accordingly, the transfer gates 42 and 43 are in a conducting state and the outputs of the inverter 44 and the NAND circuit 45 are supplied to each other's other input ends, thereby configuring the retention portion. As a result, the levels of the state retention nodes HQ and H/Q are retained.

In a transition period, one of the pulses/S and/R is at an L level and one of the pulses S and R is also at an L level, as described above. Therefore, the transfer gates 42 and 43 are off and the states of the state retention nodes HQ and H/Q are not retained. In this case, the first and second transition portions cause the state retention nodes HQ and H/Q to go to levels appropriate for the pulses/S and/R.

Now, assume that the Q and/Q outputs are cleared. In this case, the clear signal Clear goes to an H level (i.e., the inverted clear signal/Clear goes to an L level). As a result, the output of the NAND circuit 45 is fixed to an H level. In addition, the output end of the inverter 44 is fixed to an L level. Consequently, the Q output of the state retention node HQ goes to an L level and the /Q output of the state retention node H/Q goes to an H level. The Q and /Q outputs are thus cleared.

As described above, this example of modification has the same action and effect as the embodiment illustrated in FIG. 2. <Second Example of Modification (FF of Single-phase Structure)>

Figure 5:
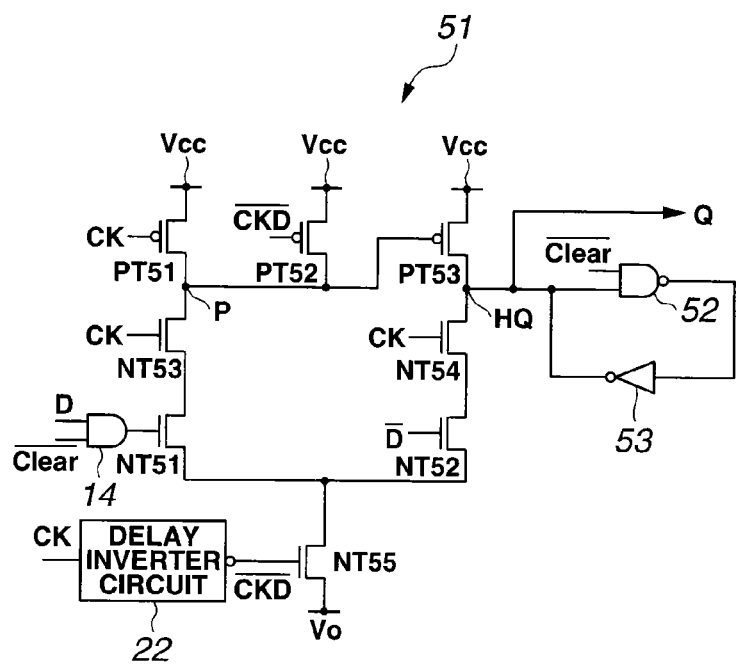
FIG. 5 is a circuit diagram illustrating a flip-flop circuit in accordance with a second example of modification of the first embodiment.

FIG. 5 is a circuit diagram illustrating a flip-flop circuit in accordance with a second example of modification. The entire configuration of this example of modification can also be represented by the circuit diagram of FIG. 1.

FIG. 5 illustrates an example wherein an FF of a single-phase structure is employed as the FF 15 illustrated in FIG. 1. In FIG. 5, constituent elements identical to those of FIG. 2 are referenced alike and excluded from the description. Note that also in FIG. 5, a configuration is shown wherein the FF has a data inverting input node /D whereto the inverted signal /D of data D is inputted, in addition to the data input node D whereto the data D is inputted. Alternatively, a configuration is possible wherein the FF has either one of the two nodes, as illustrated in FIG. 1.

In a flip-flop 51 illustrated in FIG. 5, data D and inverted data /D are respectively supplied to the gates of N-type transistors NT51 and NT52 in a differential configuration. The flip-flop 51 causes the level of a precharge node P to internally transit based on the data D and /D, thereby causing the level of a state retention node HQ to transit according to the level of the precharge node P.

The precharge node P is connected to a power supply terminal Vcc through the source-drain paths of P-type transistors PT51 and PT52. A clock CK is supplied to the gate of the transistor PT51 and an inverted clock /CKD is supplied to the gate of the transistor PT52. The inverted clock /CKD is generated by delaying and inverting the clock CK with the delay inverter circuit 22 built in the flip-flop 51.

The precharge node P is connected to a third discharging path and the source-drain paths of N-type transistors NT53 and NT51 are connected in series in the third discharging path.

In addition, the source-drain path of the transistor PT53 is connected to a first charging path between the power supply terminal Vcc and the state retention node HQ. The gate of the transistor PT53 is connected to the precharge node P.

The state retention node HQ is connected to a fourth discharging path corresponding to the above-described first discharging path and the source-drain paths of N-type transistors NT54 and NT52 are connected in series in the fourth discharging path. The drains of the transistors NT51 and NT52 are connected in common to each other and this connection point is connected to the reference potential terminal Vo through the source-drain path of an N-type transistor NT55.

The state retention node HQ is connected to one input end of a NAND circuit 52. An inverted clear signal /Clear is supplied to the other input end of the NAND circuit 52. The output end of the NAND circuit 52 is connected to the input end of an inverter 53 and the output end thereof is connected to the one input end of the NAND circuit 52. A retention portion is configured with the NAND circuit 52 and the inverter 53.

Also in this example of modification, respective operation periods, i.e., a precharge period, a transition period and a transition-forbidden period (see FIG. 3) are set in the flip-flop 51.

In a precharge period, the clock CK is at an L level and the transistor PT51 is on. As a result, the precharge node P is set to an H level. Note that in the precharge period, the inverted clock /CKD is at an H level.

When the precharge period ends and the clock CK changes to an H level, the inverted clock /CKD changes from an H level to an L level after the delay time of the delay inverter circuit 22. In a transition period, both the clock CK and the inverted clock /CKD are at an H level. In this transition period, the transistors PT51 and PT52 configured to charge the precharge node P are off and the level of the precharge node P is determined by the state of the third discharging path.

In a transition period, the transistors NT53 and NT55 are on. If the data D is at an H level (i.e., the inverted data /D is at an L level) and the inverted clear signal /Clear is also at an H level, the transistor NT51 turns on to discharge the precharge node P through the third discharging path, causing the precharge node P to internally transit to an L level. Conversely, if the data D is at an L level, the transistor NT51 is off and the precharge node P maintains itself at an H level.

When the precharge node P is at an L level, the transistor PT53 turns on and the state retention node HQ is charged. Note however that this is only true when the inverted data /D is at an L level, where the fourth discharging path connected to the state retention node HQ is cut off and the state retention node HQ transits to an H level.

Conversely, if the precharge node P is at an H level, the transistor PT53 turns off. If the inverted data /D is at an H level in a transition period, the fourth discharging path goes to a conducting state and the state retention node HQ transits to an L level.

In this way, in a transition period, H-level data D causes the state retention node HQ to go to an H level and L-level data D causes the state retention node HQ to go to an L level. The level of the state retention node HQ is outputted as a Q output.

In a precharge period and a transition-forbidden period, the precharge node P is set to an H level. Therefore, the transistor PT53 is off and the fourth discharging path is also in a non-conducting state. The NAND circuit 52 and the inverter 53, whereto each other's outputs are inputted, configure a retention portion. In other words, in a precharge period and a transition-forbidden period, the state of the state retention node HQ is retained by the NAND circuit 52 and the inverter 53.

In a clear period, the clear signal Clear is at an H level and the inverted clear signal /Clear is at an L level. Therefore, in this case, the output of the NAND circuit 52 is fixed to an H level. In addition, the output end of the inverter 53 is fixed to an L level.

On the other hand, since the inverted clear signal /Clear is at an L level, the output of an AND circuit 14 goes to an L level. Accordingly, the precharge node P maintains itself at an H level irrespective of the value of data D and the transistor PT53 remains off. Consequently, in a clear period, the Q output of the state retention node HQ goes to an L level and is thus cleared.

As described above, this example of modification has the same action and effect as the embodiment illustrated in FIG. 2.

<Third Example of Modification (Having No Precharge Nodes)>

Figure 6:
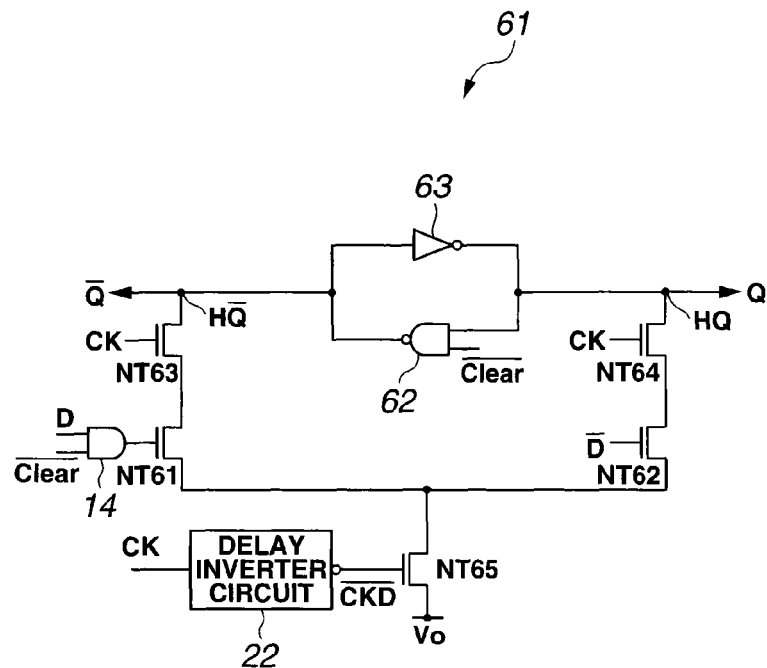
FIG. 6 is a circuit diagram illustrating a flip-flop circuit in accordance with a third example of modification of the first embodiment.

FIG. 6 is a circuit diagram illustrating a flip-flop circuit in accordance with a third example of modification. The entire configuration of this example of modification can also be represented by the circuit diagram of FIG. 1.

FIG. 6 illustrates an example wherein an FF having no precharge nodes is employed as the FF 15 illustrated in FIG.

1. In FIG. 6, constituent elements identical to those of FIG. 2 are referenced alike and excluded from the description. Note that also in FIG. 6, a configuration is shown wherein the FF has a data inverting input node/D whereto the inverted signal/D of data D is inputted, in addition to the data input node D whereto the data D is inputted. Alternatively, a configuration is possible wherein the FF has either one of the two nodes, as illustrated in FIG. 1.

In a flip-flop 61 illustrated in FIG. 6, data D and inverted data/D are respectively supplied to the gates of N-type transistors NT61 and NT62 in a differential configuration. The flip-flop 61 causes the levels of state retention nodes HQ and H/Q to transit based on the data D and/D.

The state retention node H/Q is connected to a fifth discharging path corresponding to the above-described first discharging path and the source-drain paths of N-type transistors NT63 and NT61 are connected in series in the fifth discharging path. The state retention node HQ is also connected to a sixth discharging path corresponding to the above-described first discharging path and the source-drain paths of N-type transistors NT64 and NT62 are connected in series in the sixth discharging path. The drains of the transistors NT61 and NT62 are connected in common to each other and this connection point is connected to the reference potential terminal Vo through the source-drain path of an N-type transistor NT65.

The state retention node HQ is connected to one input end of a NAND circuit 62 in a first charging path. An inverted clear signal/Clear is supplied to the other input end of the NAND circuit 62. The output end of the NAND circuit 62 in the first charging path is connected to the input end of an inverter 63 and the state retention node H/Q. The output end of the inverter 63 is connected to one input end of the NAND circuit 62. A retention portion is configured with the NAND circuit 62 and the inverter 63.

In the example of modification configured as describe above, respective operation periods, i.e., a transition period and a transition-forbidden period are set in the flip-flop 61.

A period wherein the clock CK or the inverted clock/CKD is at an L level (see FIG. 3) is set as a transition-forbidden period. The transistors NT63 to NT65 are off and the fifth and sixth discharging paths are also cut off. In addition, the NAND circuit 62 and the inverter 63, whereto each other's outputs are inputted, configure a retention portion. In other words, in a transition-forbidden period, the states of the state retention nodes HQ and H/Q are retained by the NAND circuit 62 and the inverter 63.

In a transition period, the clock CK and the inverted clock/CKD are at an H level and the transistors NT63 to NT65 are on. If the data D is at an H level (i.e., the inverted data/D is at an L level) and the inverted clear signal/Clear is also at an H level, the transistor NT61 turns on to discharge the state retention node H/Q through the fifth discharging path, causing the state retention node H/Q to transit to an L level. In this case, the state retention node HQ goes to an H level. Conversely, if the data D is at an L level, the transistor NT62 turns on and the state retention node HQ transits to an L level. In this case, the state retention node H/Q goes to an H level.

In this way, in a transition period, H-level data D causes the state retention node HQ to output an H-level Q output and the state retention node H/Q to output an L-level/Q output. In contrast, L-level data D causes the state retention node HQ to output an L-level Q output and the state retention node H/Q to output an H-level/Q output.

In a clear period, the clear signal Clear is at an H level and the inverted clear signal/Clear is at an L level. Therefore, in this case, the output of the NAND circuit 62 is fixed to an H level. In addition, the output end of the inverter 63 is fixed to an L level.

On the other hand, since the inverted clear signal/Clear is at an L level, the output of an AND circuit 14 goes to an L level. Accordingly, the output of the NAND circuit 62 causes the state retention node H/Q to maintain itself at an H level irrespective of the value of data D. In addition, the state retention node HQ maintains itself at an L level. Consequently, in a clear period, the Q output of the state retention node HQ goes to an L level and the/Q output of the state retention node H/Q goes to an H level. The Q and/Q outputs are thus cleared.

As described above, this example of modification also has the same action and effect as the embodiment illustrated in FIG. 2.

<Fourth Example of Modification (FF Externally Provided with Transition Period Pulse)>

Figure 7:
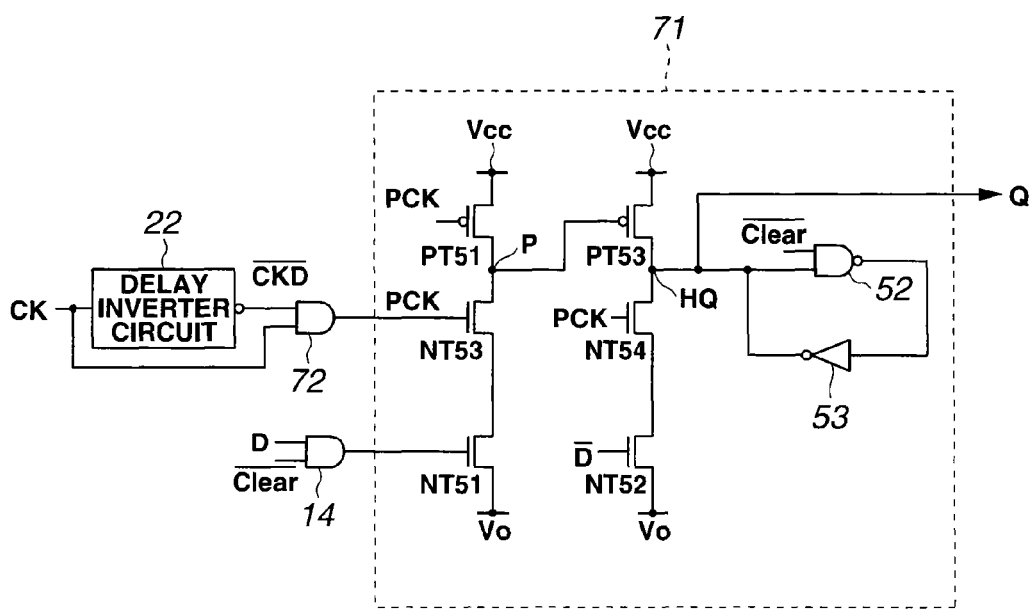
FIG. 7 is a circuit diagram illustrating a flip-flop circuit in accordance with a fourth example of modification of the first embodiment.

FIG. 7 is a circuit diagram illustrating a flip-flop circuit in accordance with a fourth example of modification. The entire configuration of this example of modification can also be represented by the circuit diagram of FIG. 1.

FIG. 7 illustrates an example wherein an FF externally provided with a transition period pulse representing a transition period is employed as the FF 15 illustrated in FIG. 1. In FIG. 7, constituent elements identical to those of FIG. 5 are referenced alike and excluded from the description.

A flip-flop 71 illustrated in FIG. 7 is identical to the flip-flop 51 illustrated in FIG. 5 except that the delay inverter circuit 22 and the transistor NT55 have been omitted from the flip-flop 51. The flip-flop 71 illustrated in FIG. 7 is configured so that a transition period pulse PCK is supplied externally. In addition, the transition period pulse PCK is supplied to the gate of the transistor PT51.

Figure 8:
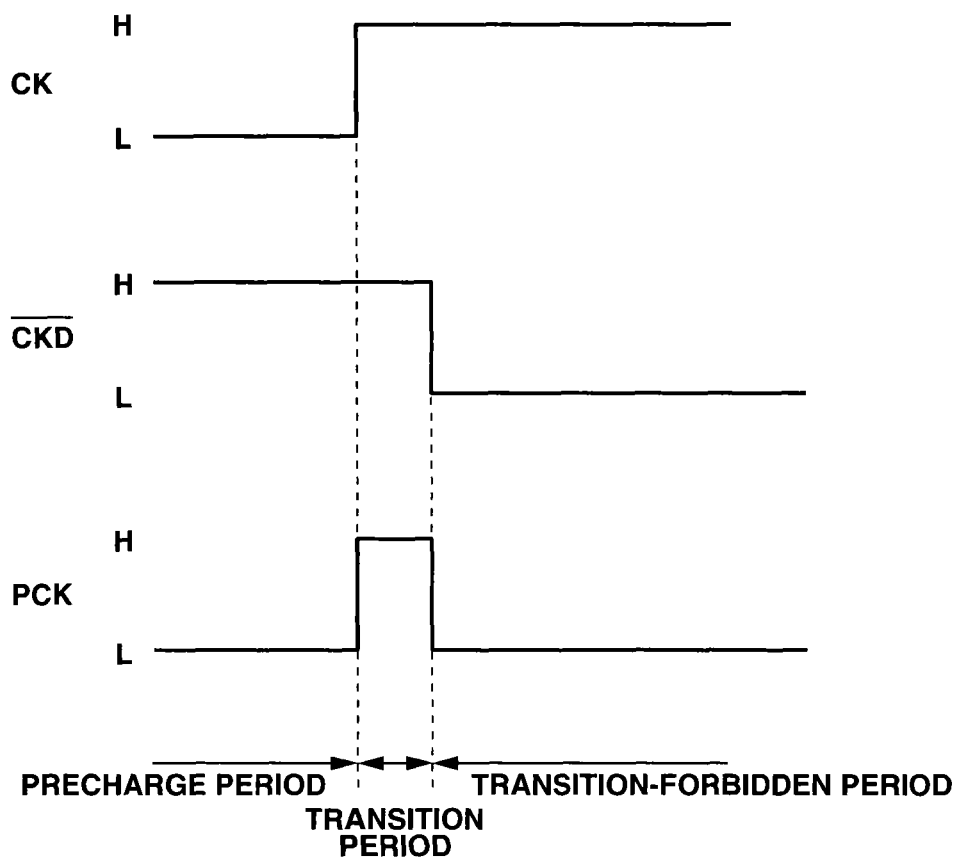
FIG. 8 is a timing chart intended to explain a transition period pulse.

FIG. 8 is a timing chart intended to explain a transition period pulse. FIG. 8 shows the clock CK, the inverted clock/CKD, and the transition period pulse PCK.

The transition period pulse PCK is generated by the delay inverter circuit 22 and an AND circuit 72. The clock CK shown in FIG. 8 is inputted to the delay inverter circuit 22. The delay inverter circuit 22 delays the clock CK, inverts the delayed clock and outputs the inverted clock/CKD shown in FIG. 8. The inverted clock/CKD from the delay inverter circuit 22 is provided to the AND circuit 72. The AND circuit 72 is also provided with the clock CK to perform a two-input AND operation. This means that the output of the AND circuit 72 is given as a pulse (transition period pulse) which goes to an H level in a period wherein both the clock CK and the inverted clock/CKD are at an H level. As described above, a period wherein the transition period pulse is at an H level is a transition period.

In this example of modification, the transistors NT53 and NT54 are provided with a transition period pulse PCK instead of a clock CK. The transistors NT53 and NT54 turn on only in a period wherein a transition period pulse PCK is at an H level.

In the example of modification illustrated in FIG. 5, the transistors NT53 and NT55 cause the third discharging path to turn on only in a transition period and the transistors NT54 and NT55 cause the fourth discharging path to turn on only in a transition period.

In contrast, in this example of modification, it is possible to turn on the third discharging path only in a transition period using the transistor NT53 and turn on the fourth discharging path only in a transition period using the transistor NT54.

The rest of the configuration and the action and effect are the same as those of the embodiment illustrated in FIG. 2.

<Second Embodiment (Addition of Preset Function)>

Figure 9:
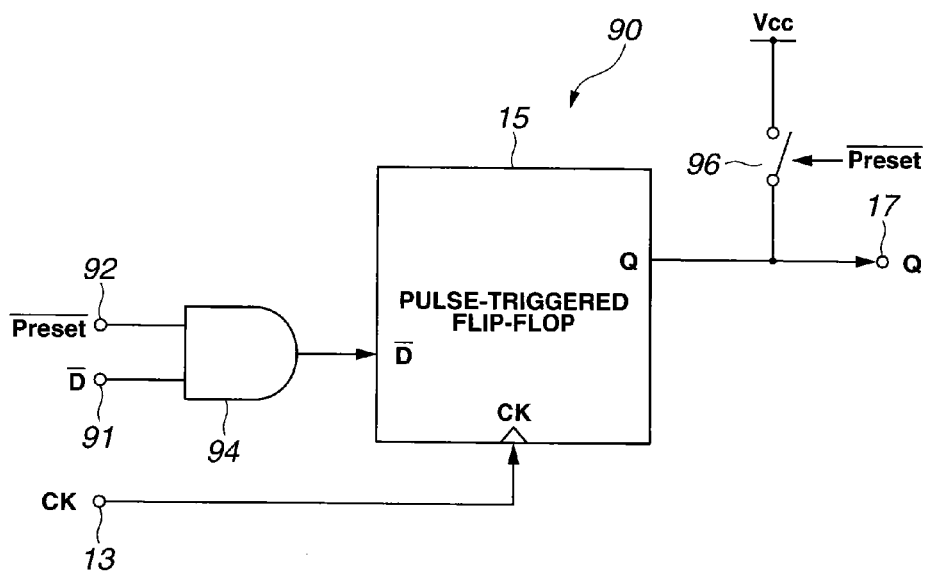
FIG. 9 pertains to a semiconductor integrated circuit device in accordance with the second embodiment of the present invention and is a circuit diagram illustrating a flip-flop circuit.

FIG. 9 pertains to a semiconductor integrated circuit device in accordance with the second embodiment of the present invention and is a circuit diagram illustrating a flip-flop circuit. In FIG. 9, constituent elements identical to those of FIG. 1 are referenced alike and excluded from the description.

A flip-flop circuit 90 is configured with an AND circuit 94, an FF 15, and a switch 96 serving as a pull-up circuit. A data input terminal 91 for the inverted data of the flip-flop circuit 90 is provided with inverted data/D. In the present embodiment, the inverted signal/Preset (inverted preset signal) of a preset signal Preset is inputted to a preset input terminal 92. The inverted data/D and inverted preset signal/Preset are provided to the AND circuit 94. The AND circuit 94 is configured so that the output thereof is supplied to a data input inverting node/D for the inverted signal of the FF 15.

An output node Q is connected to an H-level power supply terminal Vcc through the switch 96. The switch 96 is turned on by an L-level inverted preset signal/Preset, causing the output node Q to transit to an H level.

Table 2 below shows the truth table of the flip-flop circuit 90.

TABLE 2

| D | $\overline{Preset}$ | PCK | Qn + 1 |
|---|---|---|---|
| X | L | X | H |
| L | H | rise | L |
| H | H | rise | H |
| X | H | fall | Qn |

In the truth table shown in Table 2, the column D represents whether the data D is at an H level or an L level, the/Preset column represents whether the inverted preset signal/Preset is at an H level or an L level, the PCK column represents whether the period in question is a transition period (rise) or not (fall), and the Qn+1 column represents an output after the output node Q is updated. Note that Qn denotes an output before the output node Q is updated.

(FF Having Pulse Generator Portion and RS Latch Portion)

Figure 10:
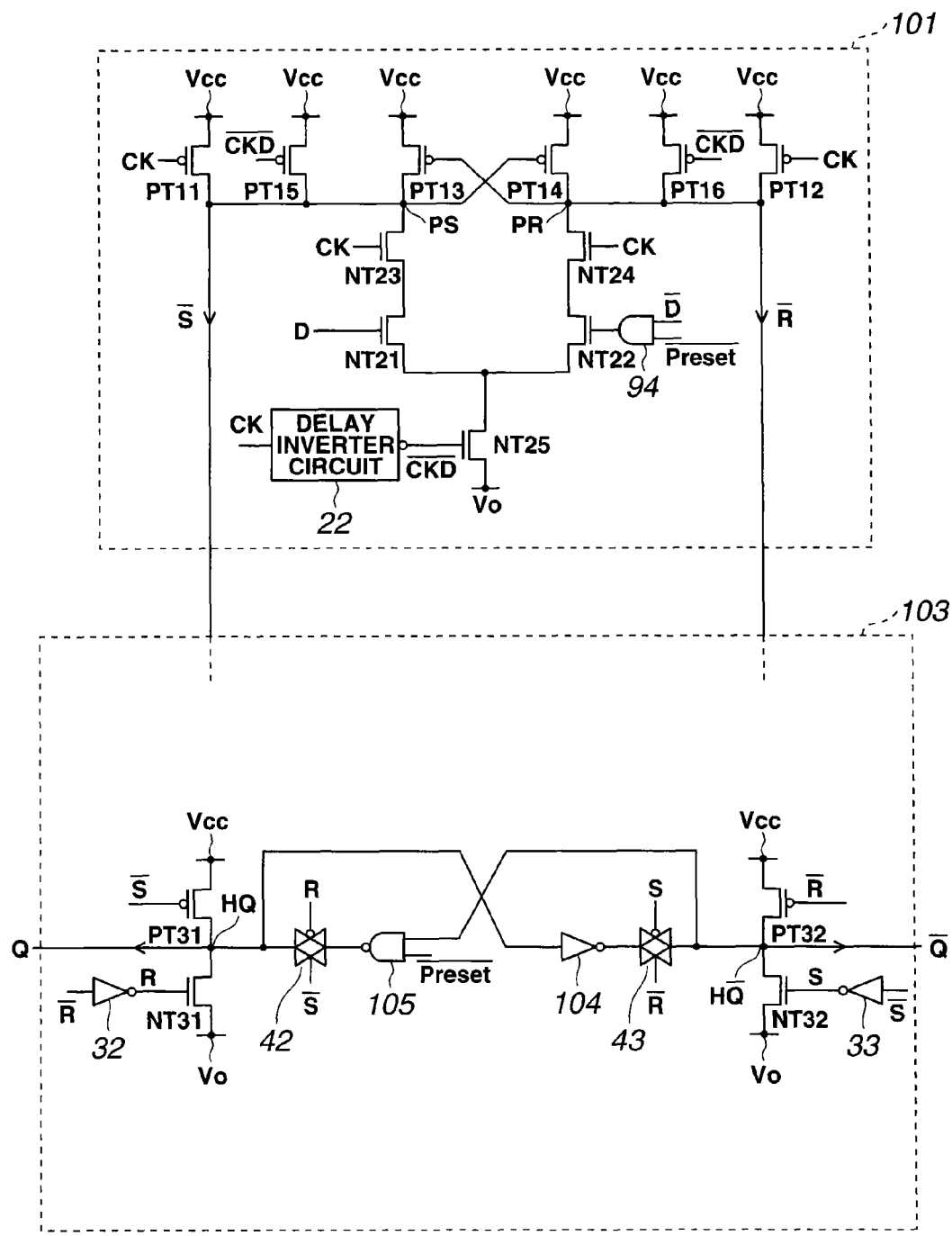
FIG. 10 is a circuit diagram illustrating a specific configuration of the flip-flop circuit shown in FIG. 9.

FIG. 10 is a circuit diagram illustrating a specific configuration of the flip-flop circuit shown in FIG. 9. In FIG. 10, constituent elements identical to those of FIGS. 2 and 4 are referenced alike and excluded from the description.

FIG. 10 illustrates an example wherein an FF configured with a pulse generator portion 101 and an RS latch portion 103 is employed as the FF 15. Although the example shows a case where the AND circuit 94 is built in the pulse generator portion 101 configuring the FF 15, the AND circuit 94 may be configured external to the FF 15, as illustrated in FIG. 9. Furthermore, in FIG. 10, a configuration is shown wherein the FF has a data input node D whereto data D is inputted, in addition to a data inverting input node/D whereto data/D is inputted. Alternatively, a configuration is possible wherein the FF has either one of the two nodes, as illustrated in FIG. 9.

<Pulse Generator Portion>

The pulse generator portion 101 illustrated in FIG. 10 differs from the pulse generator portion 21 shown in FIG. 2 only in that data D is supplied to the gate of a transistor NT21 and the output of the AND circuit 94 is supplied to the gate of a transistor NT22.

When the inverted preset signal/Preset is at an H level, inverted data/D is supplied to the transistor NT22. In this case, the levels of pulses/S and/R are determined in a transition period based on the data D and/D.

When the inverted preset signal/Preset is at an L level, the gate of the transistor NT22 goes to an L level and, therefore, the transistor NT22 turns off. Consequently, in this case, the pulse/R remains at an H level even in a transition period.

<RS Latch Portion>

The RS latch portion 103 illustrated in FIG. 10 differs from the RS latch portion 41 shown in FIG. 4 in that a NAND circuit 105 and an inverter 104 are employed respectively in place of the inverter 44 and the NAND circuit 45. The state retention node HQ is connected to the input end of the inverter 104 and the Q output is inverted by the inverter 104 and is supplied to the input end of a transfer gate 43. In addition, the state retention node H/Q is connected to one input end of the NAND circuit 105 and an inverted preset signal/Preset is supplied to the other input end of the NAND circuit 105. The NAND circuit 105 supplies the result of a two-input NAND operation to the input end of the transfer gate 42. A retention portion is configured with the inverter 104 and the NAND circuit 105.

When the inverted preset signal/Preset is at an H level, the NAND circuit 105 is equivalent to an inverter that invertedly outputs the input signal thereof. In other words, two inverters whereto each other's outputs are inputted are configured with the inverter 104 and the NAND circuit 105. With these inverters, it is possible to retain the states of the state retention nodes HQ and H/Q.

In a precharge period and a transition-forbidden period, the pulses/S and/R are at an H level. Accordingly, the transfer gates 42 and 43 are in a conducting state and the outputs of the inverter 104 and the NAND circuit 105 are supplied to each other's other input ends, thereby configuring the retention portion. As a result, the levels of the state retention nodes HQ and H/Q are retained.

In a transition period, one of the pulses/S and/R is at an L level and one of the pulses S and R is also at an L level, as described above. Therefore, the transfer gates 42 and 43 are off and the states of the state retention nodes HQ and H/Q are not retained. In this case, the first and second transition portions cause the state retention nodes HQ and H/Q to go to levels appropriate for the pulses/S and/R.

In the present embodiment, when the preset signal Preset is at an L level (i.e., the inverted preset signal/Preset is at an H level), the state retention nodes HQ and H/Q are not affected by the preset signal Preset (inverted preset signal/Preset). However, when the preset signal Preset is at an H level (i.e., the inverted preset signal/Preset is at an L level), the output of the NAND circuit 105 is fixed to an H level. In addition, the output end of the inverter 104 is fixed to an L level. Consequently, the Q output of the state retention node HQ goes to an H level and the /Q output of the state retention node H/Q goes to an L level. The Q and/Q outputs are thus preset.

Incidentally, in a precharge period and a transition-forbidden period, both the pulse/S and the pulse/R are at an H level and the first and second state transition portions are in a disabled state, as described above. In a transition period, however, one of the pulses/S and/R internally transits to an L level. If the pulse/R internally transits to an L level in a period wherein the preset signal Preset intended to preset the Q output is at an H level, the transistors NT31 and PT32 turn on. As a result, the state retention node HQ is connected to the reference potential terminal Vo and the state retention node H/Q is connected to the power supply terminal Vcc. This means that the power supply terminal Vcc and the reference potential terminal Vo fall into a short-circuited state.

For this reason, it is not possible to preset the Q and/Q outputs simply by providing charging and discharging paths for preset purposes in the state retention nodes HQ and H/Q. Hence, in the present embodiment, the AND circuit 94 is provided on the pulse generator side.

An inverted preset signal/Preset is supplied to the AND circuit 94. More specifically, when the inverted preset signal/Preset is at an L level, i.e., the preset signal Preset is at an H level, the output of the AND circuit 94 goes to an L level. Consequently, even when data D is at an H level, the transistor NT22 remains off and the precharge node PR maintains itself at an H level. In other words, in a preset period wherein the preset signal Preset is at an H level, the pulse/R always goes to an H level. Accordingly, the transistors NT31 and PT32 are always off in a preset period and, therefore, it is possible to set the state retention node HQ to an H level without causing any short circuits. This is also true for the state retention node H/Q.

In the embodiment configured as described above, a normal operation takes place when the preset signal Preset is at an L level (i.e., the inverted preset signal /Preset is at an H level). In other words, in this case, there takes place the same operation as that when the clear signal Clear is at an L level (i.e., the inverted clear signal/Clear is at an H level) in the first embodiment.

To preset the Q and/Q outputs, the preset signal Preset is set to an H level (i.e., the inverted preset signal/Preset is set to an L level). As a result, the output of the NAND circuit 105 is fixed to an H level. In addition, the output end of the inverter 104 is fixed to an L level. Consequently, the Q output of the state retention node HQ goes to an H level and the/Q output of the state retention node H/Q goes to an L level. The Q and/Q outputs are thus preset.

<First Example of Modification (FF of Single-phase Structure)>

Figure 11:
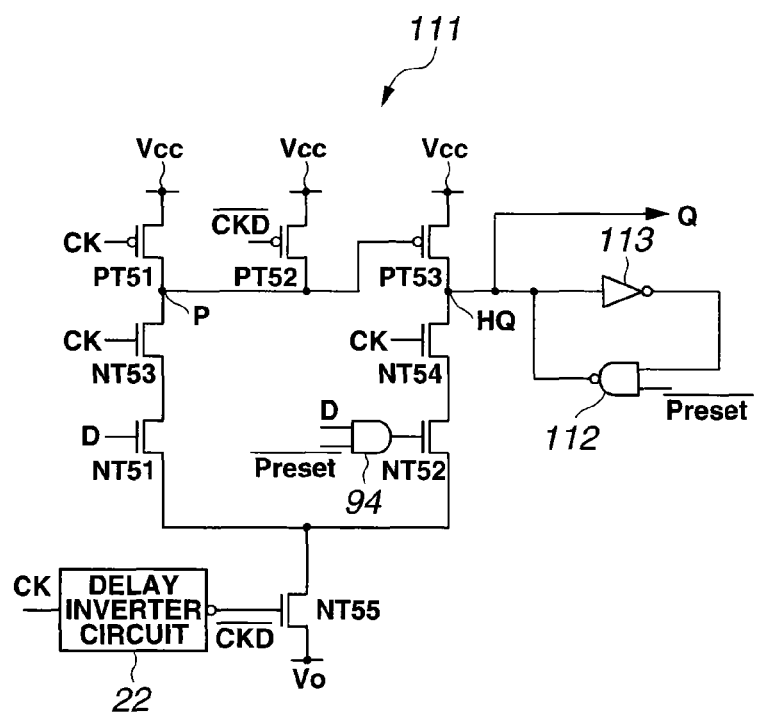
FIG. 11 is a circuit diagram illustrating a flip-flop circuit in accordance with a first example of modification of the second embodiment.

FIG. 11 is a circuit diagram illustrating a flip-flop circuit in accordance with a first example of modification. The entire configuration of this example of modification can also be represented by the circuit diagram of FIG. 9.

FIG. 11 illustrates an example wherein an FF of a single-phase structure is employed as the FF 15 shown in FIG. 9. In FIG. 11, constituent elements identical to those of FIG. 5 are referenced alike and excluded from the description.

A flip-flop 111 illustrated in FIG. 11 differs from the flip-flop 51 illustrated in FIG. 5 in that data D is directly supplied to the gate of the transistor NT51, the output of the AND circuit 94 is supplied to the gate of the transistor NT52, and an inverter 113 and a NAND circuit 112 are employed respectively in place of the NAND circuit 52 and the inverter 53.

When the inverted preset signal/Preset is at an H level, inverted data/D is supplied to the transistor NT52. In this case, the level of the Q output is determined in a transition period according to the data D and/D.

When the inverted preset signal/Preset is at an L level, the gate of the transistor NT52 goes to an L level and, therefore, the transistor NT52 turns off. Consequently, in this case, the state retention node HQ remains at an H level even in a transition period.

The state retention node HQ is connected to the input end of the inverter 113 and the Q output is inverted by the inverter 113 and is provided to one input end of a NAND circuit 112. An inverted preset signal/Preset is supplied to the other input end of the NAND circuit 112. The output end of the NAND circuit 112 is connected to the input end (state retention node HQ) of the inverter 113. A retention portion is configured with the inverter 113 and the NAND circuit 112.

When the inverted preset signal/Preset is at an H level, the NAND circuit 112 is equivalent to an inverter that invertedly outputs the input signal thereof. In other words, two inverters whereto each other's outputs are inputted are configured with the inverter 113 and the NAND circuit 112. With these inverters, it is possible to retain the state of the state retention node HQ.

In the example of modification configured as described above, a normal operation inherent in flip-flops takes place when the inverted preset signal/Preset is at an L level. In a preset period, the preset signal Preset is at an H level and the inverted preset signal/Preset is at an L level. Consequently, in this case, the output of the NAND circuit 112 is fixed to an H level.

On the other hand, since the inverted preset signal/Preset is at an L level, the output of the AND circuit 94 goes to an L level. Accordingly, the transistor NT52 remains off and the state retention node HQ maintains itself at an H level irrespective of the value of data/D. In this way, in a preset period, there takes place a preset operation to cause the Q output of the state retention node HQ to go to an H level.

As described above, this example of modification also has the same action and effect as the embodiment illustrated in FIG. 10.

<Second Example of Modification (FF Having No Precharge Nodes)>

Figure 12:
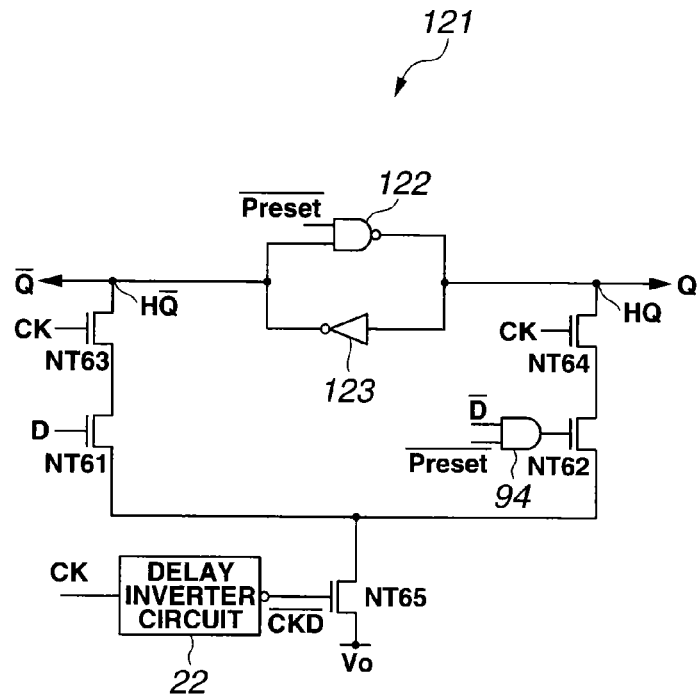
FIG. 12 is a circuit diagram illustrating a flip-flop circuit in accordance with a second example of modification of the second embodiment.

FIG. 12 is a circuit diagram illustrating a flip-flop circuit in accordance with a second example of modification. The entire configuration of this example of modification can also be represented by the circuit diagram of FIG. 9.

FIG. 12 illustrates an example wherein an FF having no precharge nodes is employed as the FF 15 shown in FIG. 9. In FIG. 12, constituent elements identical to those of FIG. 6 are referenced alike and excluded from the description.

A flip-flop 121 illustrated in FIG. 12 differs from the flip-flop 61 illustrated in FIG. 6 in that data D is directly supplied to the gate of a transistor NT61, the output of the AND circuit 94 is supplied to the gate of a transistor NT62, and an inverter 123 and a NAND circuit 122 are employed respectively in place of the NAND circuit 62 and the inverter 63.

When the inverted preset signal/Preset is at an H level, inverted data/D is supplied to the transistor NT62. In this case, the levels of the Q and/Q outputs are determined in a transition period according to the data D and/D.

When the inverted preset signal/Preset is at an L level, the gate of the transistor NT62 goes to an L level and, therefore, the transistor NT62 turns off. Consequently, in this case, the state retention node HQ remains at an H level even in a transition period.

The state retention node HQ is connected to the input end of the inverter 123 and the Q output is inverted by the inverter 123 and is provided to one input end of a NAND circuit 122. An inverted preset signal/Preset is supplied to the other input end of the NAND circuit 122. The output end of the NAND circuit 122 is connected to the input end (state retention node HQ) of the inverter 123. A retention portion is configured with the inverter 123 and the NAND circuit 122.

When the inverted preset signal/Preset is at an H level, the NAND circuit 122 is equivalent to an inverter that invertedly outputs the input signal thereof. In other words, two inverters whereto each other's outputs are inputted are configured with the inverter 123 and the NAND circuit 122. With these inverters, it is possible to retain the state of the state retention node HQ.

In the example of modification configured as described above, a normal operation inherent in flip-flops takes place when the inverted preset signal/Preset is at an L level. In a preset period, the preset signal Preset is at an H level and the inverted preset signal/Preset is at an L level. Consequently, in this case, the output of the NAND circuit 122 is fixed to an H level.

On the other hand, since the inverted preset signal/Preset is at an L level, the output of the AND circuit 94 goes to an L level. Accordingly, the transistor NT62 remains off and the discharging path of the state retention node HQ does not go to a conducting state. Thus, the state retention node HQ maintains itself at an H level irrespective of the value of data/D. In this way, in a preset period, it is possible to set the Q output of the state retention node HQ to an H level and the/Q output of the state retention node H/Q to an L level.

As described above, this example of modification also has the same action and effect as the embodiment illustrated in FIG. 10.

<Third Example of Modification (FF Externally Provided with Transition Period Pulse)>

Figure 13:
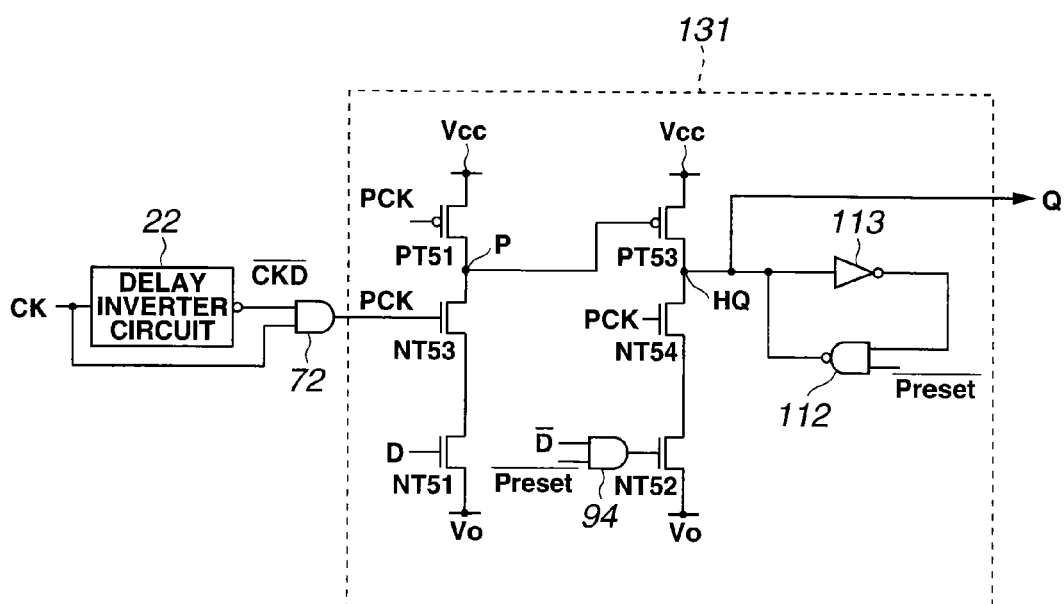
FIG. 13 is a circuit diagram illustrating a flip-flop circuit in accordance with a third example of modification of the second embodiment.

FIG. 13 is a circuit diagram illustrating a flip-flop circuit in accordance with a third example of modification. The entire configuration of this example of modification can also be represented by the circuit diagram of FIG. 9.

FIG. 13 illustrates an example wherein an FF externally provided with a transition period pulse representing a transition period is employed as the FF 15 illustrated in FIG. 9. In FIG. 13, constituent elements identical to those of FIG. 7 are referenced alike and excluded from the description.

A flip-flop 131 illustrated in FIG. 13 differs from the flip-flop 71 illustrated in FIG. 7 in that data D is directly supplied to the gate of a transistor NT51, the output of the AND circuit 94 is supplied to the gate of a transistor NT52, and an inverter 113 and a NAND circuit 112 are employed respectively in place of the NAND circuit 52 and the inverter 53.

When the inverted preset signal/Preset is at an H level, inverted data/D is supplied to the transistor NT52. In this case, the level of the Q output is determined in a transition period according to the data D and/D.

When the inverted preset signal/Preset is at an L level, the gate of the transistor NT52 goes to an L level and, therefore, the transistor NT52 turns off. Consequently, in this case, the state retention node HQ remains at an H level even in a transition period.

The state retention node HQ is connected to the input end of the inverter 113 and the Q output is inverted by the inverter 113 and is provided to one input end of a NAND circuit 112. An inverted preset signal/Preset is supplied to the other input end of the NAND circuit 112. The output end of the NAND circuit 112 is connected to the input end (state retention node HQ) of the inverter 113. A retention portion is configured with the inverter 113 and the NAND circuit 112.

When the inverted preset signal/Preset is at an H level, the NAND circuit 112 is equivalent to an inverter that invertedly outputs the input signal thereof. In other words, two inverters whereto each other's outputs are inputted are configured with the inverter 113 and the NAND circuit 112. With these inverters, it is possible to retain the state of the state retention node HQ.

In the example of modification configured as described above, a normal operation inherent in flip-flops takes place when the inverted preset signal/Preset is at an L level. In a preset period, the preset signal Preset is at an H level and the inverted preset signal/Preset is at an L level. Consequently, in this case, the output of the NAND circuit 112 is fixed to an H level.

On the other hand, since the inverted preset signal/Preset is at an L level, the output of the AND circuit 94 goes to an L level. Accordingly, the transistor NT52 remains off and the state retention node HQ maintains itself at an H level irrespective of the value of data/D. In this way, in a preset period, there takes place a preset operation to set the Q output of the state retention node HQ to an H level.

As described above, this example of modification also has the same action and effect as the embodiment illustrated in FIG. 10.

<Third Embodiment (Addition of Clear and Preset Functions)>

Figure 14:
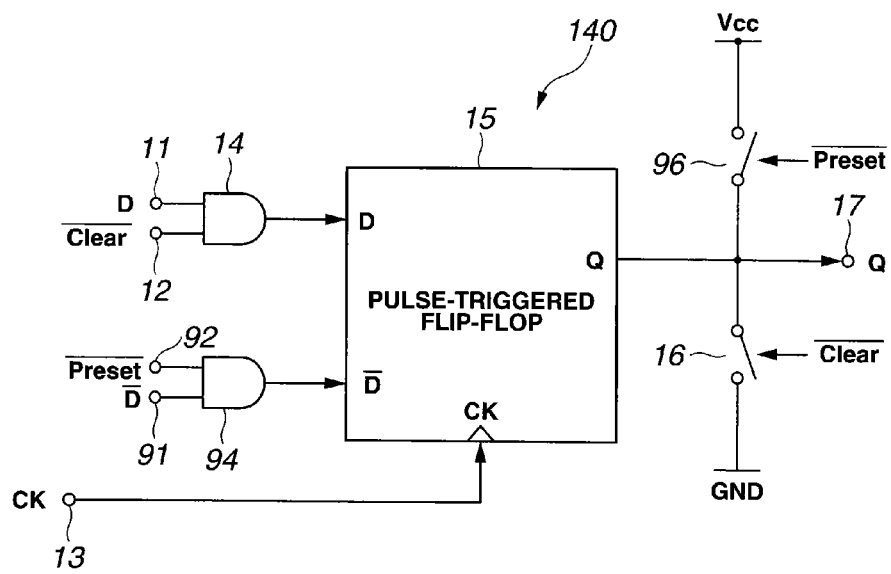
FIG. 14 pertains to a semiconductor integrated circuit device in accordance with the third embodiment of the present invention and is a circuit diagram illustrating a flip-flop circuit.

FIG. 14 pertains to a semiconductor integrated circuit device in accordance with the third embodiment of the present invention and is a circuit diagram illustrating a flip-flop circuit. In FIG. 14, constituent elements identical to those of FIGS. 1 and 9 are referenced alike and excluded from the description.

The present embodiment is a combination of the first and second embodiments. A flip-flop circuit 140 is configured with AND circuits 14 and 94, an FF 15 and switches 16 and 96. More specifically, data D is inputted to the data input node D of the FF 15 through the AND circuit 14 and inverted data/D is inputted to the data input inverting node/D of the FF 15 through the AND circuit 94.

The AND circuits 14 and 94 output the input data D and/D only when an H-level inverted clear signal/Clear and an H-level inverted preset signal/Preset are respectively inputted thereto, as with the first and second embodiments.

In addition, the switch 16 is turned on by an L-level inverted clear signal /Clear and causes the output node Q to transit to an L level. Likewise, the switch 96 is turned on by an L-level inverted preset signal/Preset and causes the output node Q to transit to an H level.

Table 3 below shows the truth table of the flip-flop circuit 140.

TABLE 3

| D | $\overline{\text{Clear}}$ | $\overline{\text{Preset}}$ | PCK | Qn + 1 |
|---|---|---|---|---|
| X | L | H | X | L |
| X | H | L | X | H |
| X | L | L | X | Forbidden term |
| L | H | H | rise | L |
| H | H | H | rise | H |
| X | H | H | fall | Qn |

In the truth table shown in Table 3, the column D represents whether the data D is at an H level or an L level, the/Preset column represents whether the inverted preset signal/Preset is at an H level or an L level, the PCK column represents whether the period in question is a transition period (rise) or not (fall), and the Qn+1 column represents an output after the output node Q is updated. Note that Qn denotes an output before the output node Q is updated.

If both of the switches 16 and 96 turn on simultaneously, the power supply terminal Vcc and the reference potential terminal Vo are short-circuited. A forbidden term is therefore set in order to prevent the switches 16 and 96 from turning on simultaneously.

(FF Having Pulse Generator Portion and RS Latch Portion)

Figure 15:
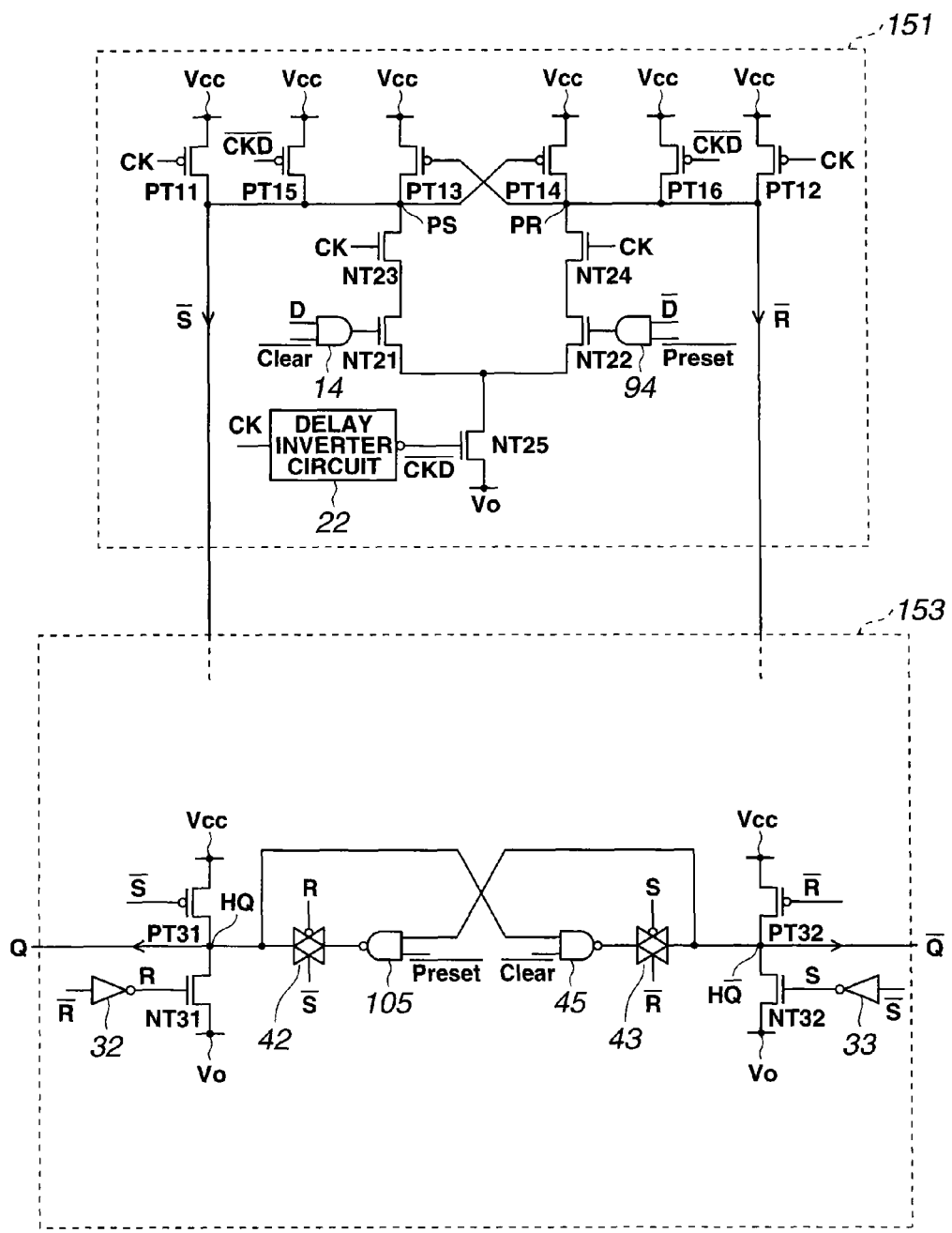
FIG. 15 is a circuit diagram illustrating a specific configuration of the flip-flop circuit shown in FIG. 14.

FIG. 15 is a circuit diagram illustrating a specific configuration of the flip-flop circuit shown in FIG. 14. In FIG. 15, constituent elements identical to those of FIGS. 2, 4 and 10 are referenced alike and excluded from the description.

FIG. 15 illustrates an example wherein an FF configured with a pulse generator portion 151 and an RS latch portion 153 is employed as the FF 15.

The pulse generator portion 151 illustrated in FIG. 15 differs from the pulse generator portion 21 illustrated in FIG. 2 or the pulse generator portion 101 illustrated in FIG. 10 only in that the pulse generator portion 151 includes both the AND circuit 14 shown in FIG. 2 and the AND circuit 94 shown in FIG. 10.

When both the inverted clear signal/Clear and the inverted preset signal /Preset are at an H level, data D is directly supplied to the gate of the transistor NT21 and inverted data/D is also directly supplied to the gate of the transistor NT22. Consequently, in this case, a normal operation takes place and pulses/S and/R appropriate for the data D and/D are obtained.

As described above, the inverted clear signal/Clear and the inverted preset signal/Preset never go to an L level simultaneously. When the inverted clear signal /Clear is at an L level and the inverted preset signal/Preset is at an H level, the same configuration as that of the pulse generator portion 21 shown in FIG. 2 can be obtained. Conversely, when the inverted clear signal/Clear is at an H level and the inverted preset signal/Preset is at an L level, the same configuration as that of the pulse generator portion 101 shown in FIG. 10 can be obtained.

Consequently, the pulse/S of the pulse generator portion 151 remains at an H level even in a transition period when the inverted clear signal/Clear is at an L level. Conversely, the pulse/R of the pulse generator portion 151 remains at an H level even in a transition period when the inverted preset signal/Preset is at an L level. The RS latch portion 153 illustrated in FIG. 15 differs from the RS latch portion 41 illustrated in FIG. 4 or the RS latch portion 103 illustrated in FIG. 10 only in that the RS latch portion 153 includes both the NAND circuit 45 shown in FIG. 4 and the NAND circuit 105 shown in FIG. 10.

When both the inverted clear signal/Clear and the inverted preset signal /Preset are at an H level, the Q output of the state retention node HQ is directly supplied to the input end of the transfer gate 43 and the/Q output of the state retention node H/Q is directly supplied to the input end of the transfer gate 42. Consequently, in this case, a normal retention operation takes place and the Q and/Q outputs of the state retention nodes HQ and H/Q are retained.

As described above, the inverted clear signal/Clear and the inverted preset signal/Preset never go to an L level simultaneously. When the inverted clear signal /Clear is at an L level and the inverted preset signal/Preset is at an H level, the same configuration as that of the RS latch portion 41 shown in FIG. 4 can be obtained. Conversely, when the inverted clear signal/Clear is at an H level and the inverted preset signal/Preset is at an L level, the same configuration as that of the RS latch portion 103 shown in FIG. 10 can be obtained.

Consequently, the RS latch portion 153 forcibly sets the state retention node H/Q to an H level and the state retention node HQ to an L level when the inverted clear signal/Clear is at an L level. Conversely, the RS latch portion 153 forcibly sets the state retention node HQ to an H level and the state retention node H/Q to an L level when the inverted preset signal/Preset is at an L level.

In the embodiment configured as described above, the inverted clear signal /Clear and the inverted preset signal/Preset never go to an L level simultaneously. When the inverted clear signal/Clear is at an L level and the inverted preset signal /Preset is at an H level, the same configuration as illustrated in FIGS. 2 and 4 can be obtained. Consequently, in this case, an L-level Q output is obtained from the state retention node HQ and an H-level/Q output is obtained from the state retention node H/Q.

Conversely, when the inverted clear signal/Clear is at an H level and the inverted preset signal/Preset is at an L level, the same configuration as illustrated in FIG. 10 can be obtained. Consequently, in this case, an H-level Q output is obtained from the state retention node HQ and an L-level/Q output is obtained from the state retention node H/Q.

In either of these cases, the power supply terminal Vcc and the reference potential terminal Vo are never short-circuited.

In the embodiment configured as described above, the Q and/Q outputs can be cleared and preset without short-circuiting the power supply terminal and the reference potential terminal. Thus, it is possible to obtain the same effect as provided by a combination of the first and second embodiments.

<First Example of Modification (FF of Single-phase Structure)>

Figure 16:
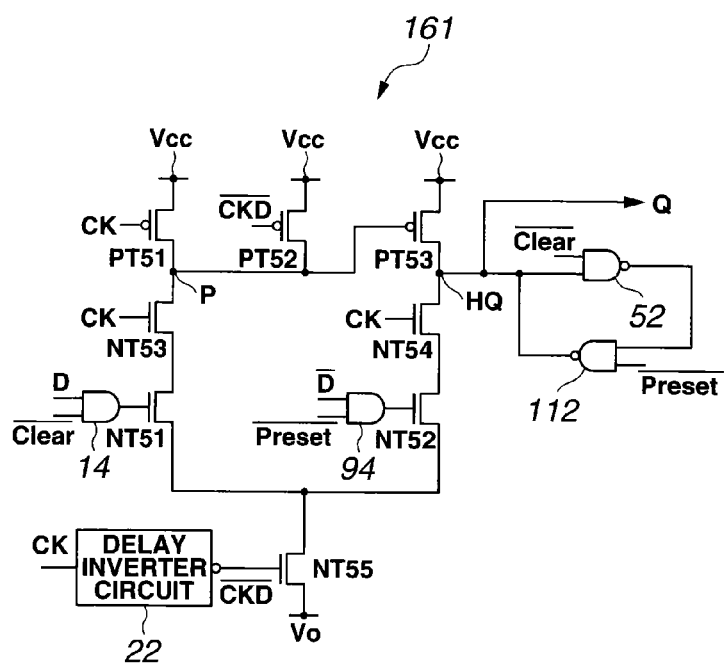
FIG. 16 is a circuit diagram illustrating a flip-flop circuit in accordance with a first example of modification of the third embodiment.

FIG. 16 is a circuit diagram illustrating a flip-flop circuit in accordance with a first example of modification. The entire configuration of this example of modification can also be represented by the circuit diagram of FIG. 14.

FIG. 16 illustrates an example wherein an FF of a single-phase structure is employed as the FF 15 illustrated in FIG. 14. In FIG. 16, constituent elements identical to those of FIGS. 5 and 11 are referenced alike and excluded from the description.

The flip-flop 161 illustrated in FIG. 16 differs from the flip-flop 51 illustrated in FIG. 5 or the flip-flop 111 illustrated in FIG. 11 in that the flip-flop 161 includes both the AND circuit 14 shown in FIG. 5 and the AND circuit 94 shown in FIG. 11.

Furthermore, the flip-flop 161 illustrated in FIG. 16 differs from the flip-flop 51 illustrated in FIG. 5 or the flip-flop 111 illustrated in FIG. 11 in that the flip-flop 161 includes both the NAND circuit 52 shown in FIG. 5 and the NAND circuit 112 shown in FIG. 11.

The rest of the configuration is the same as those of the flip-flops 51 and 111 respectively illustrated in FIGS. 5 and 11.

In the example of modification configured as described above, the inverted clear signal/Clear and the inverted preset signal/Preset never go to an L level simultaneously. When the inverted clear signal/Clear is at an L level and the inverted preset signal/Preset is at an H level, the same configuration as illustrated in FIG. 5 can be obtained. Consequently, in this case, an L-level Q output is obtained from the state retention node HQ and an H-level/Q output is obtained from the state retention node H/Q.

Conversely, when the inverted clear signal/Clear is at an H level and the inverted preset signal/Preset is at an L level, the same configuration as illustrated in FIG. 11 can be obtained. Consequently, in this case, an H-level Q output is obtained from the state retention node HQ and an L-level/Q output is obtained from the state retention node H/Q.

In either of these cases, the power supply terminal Vcc and the reference potential terminal Vo are never short-circuited.

As described above, also in this example of modification, the same effect as that of the embodiment illustrated in FIG. 15 can be obtained. <Second Example of Modification (FF Having No Precharge Nodes)>

Figure 17:
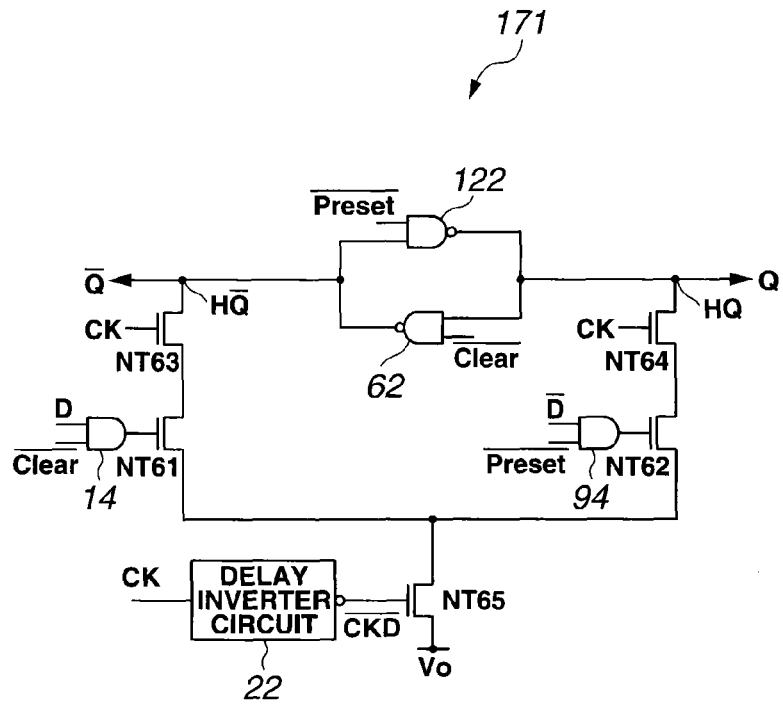
FIG. 17 is a circuit diagram illustrating a flip-flop circuit in accordance with a second example of modification of the third embodiment.

FIG. 17 is a circuit diagram illustrating a flip-flop circuit in accordance with a second example of modification. The entire configuration of this example of modification can also be represented by the circuit diagram of FIG. 14.

FIG. 17 illustrates an example wherein an FF having no precharge nodes is employed as the FF 15 illustrated in FIG. 14. In FIG. 17, constituent elements identical to those of FIGS. 6 and 12 are referenced alike and excluded from the description.

A flip-flop 171 illustrated in FIG. 17 differs from the flip-flop 61 illustrated in FIG. 6 or the flip-flop 121 illustrated in FIG. 12 in that the flip-flop 171 includes both the AND circuit 14 shown in FIG. 6 and the AND circuit 94 shown in FIG. 12.

Furthermore, the flip-flop 171 illustrated in FIG. 17 differs from the flip-flop 61 illustrated in FIG. 6 or the flip-flop 121 illustrated in FIG. 12 in that the flip-flop 171 includes both the NAND circuit 62 shown in FIG. 6 and the NAND circuit 122 shown in FIG. 12.

The rest of the configuration is the same as those of the flip-flops 61 and 121 respectively illustrated in FIGS. 6 and 12.

In the example of modification configured as described above, the inverted clear signal/Clear and the inverted preset signal/Preset never go to an L level simultaneously. When the inverted clear signal/Clear is at an L level and the inverted preset signal/Preset is at an H level, the same configuration as illustrated in FIG. 6 can be obtained. Consequently, in this case, an L-level Q output is obtained from the state retention node HQ and an H-level/Q output is obtained from the state retention node H/Q.

Conversely, when the inverted clear signal/Clear is at an H level and the inverted preset signal/Preset is at an L level, the same configuration as illustrated in FIG. 12 can be obtained. Consequently, in this case, an H-level Q output is obtained from the state retention node HQ and an L-level/Q output is obtained from the state retention node H/Q.

In either of these cases, the power supply terminal Vcc and the reference potential terminal Vo are never short-circuited.

As described above, also in this example of modification, the same effect as that of the embodiment illustrated in FIG. 15 can be obtained.

<Third Example of Modification (FF Externally Provided with Transition Period Pulse)>

Figure 18:
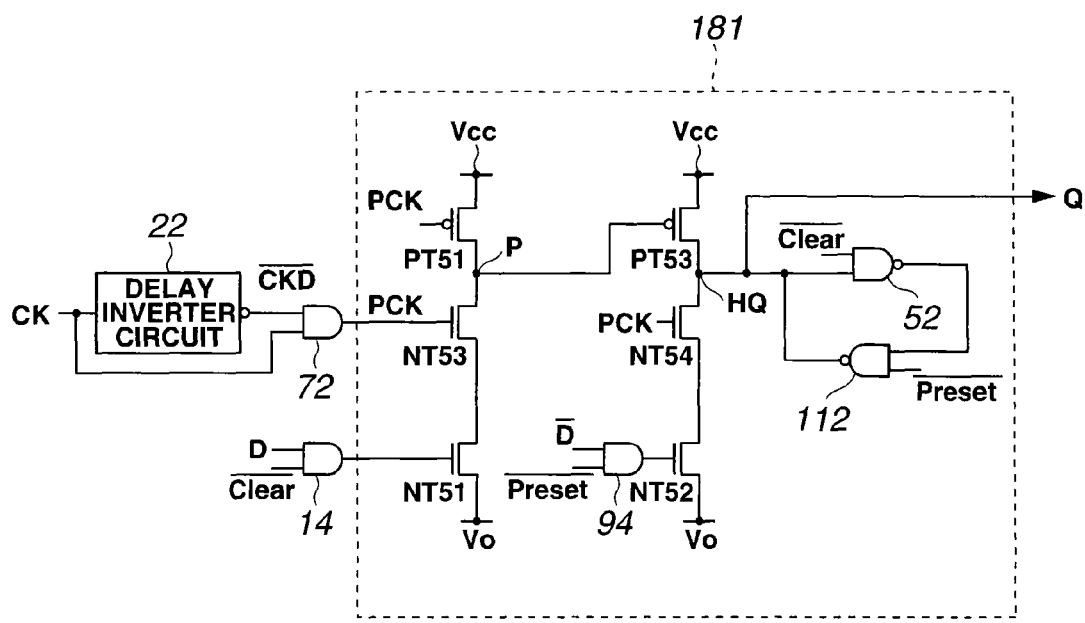
FIG. 18 is a circuit diagram illustrating a flip-flop circuit in accordance with a third example of modification of the third embodiment.

FIG. 18 is a circuit diagram illustrating a flip-flop circuit in accordance with a third example of modification. The entire configuration of this example of modification can also be represented by the circuit diagram of FIG. 14.

FIG. 18 illustrates an example wherein an FF externally provided with a transition period pulse is employed as the FF 15 illustrated in FIG. 14. In FIG. 18, constituent elements identical to those of FIGS. 7 and 13 are referenced alike and excluded from the description.

A flip-flop 181 illustrated in FIG. 18 differs from the flip-flop 71 illustrated in FIG. 7 or the flip-flop 131 illustrated in FIG. 13 in that the flip-flop 181 includes both the AND circuit 14 shown in FIG. 7 and the AND circuit 94 shown in FIG. 13.

Furthermore, the flip-flop 181 illustrated in FIG. 18 differs from the flip-flop 71 illustrated in FIG. 7 or the flip-flop 131 illustrated in FIG. 13 in that the flip-flop 181 includes both the NAND circuit 52 shown in FIG. 7 and the NAND circuit 112 shown in FIG. 13.

The rest of the configuration is the same as those of the flip-flops 71 and 131 respectively illustrated in FIGS. 7 and 13.

In the example of modification configured as described above, the inverted clear signal/Clear and the inverted preset signal/Preset never go to an L level simultaneously. When the inverted clear signal/Clear is at an L level and the inverted preset signal/Preset is at an H level, the same configuration as illustrated in FIG. 7 can be obtained. Consequently, in this case, an L-level Q output is obtained from the state retention node HQ and an H-level/Q output is obtained from the state retention node H/Q.

Conversely, when the inverted clear signal/Clear is at an H level and the inverted preset signal/Preset is at an L level, the same configuration as illustrated in FIG. 13 can be obtained. Consequently, in this case, an H-level Q output is obtained from the state retention node HQ and an L-level/Q output is obtained from the state retention node H/Q.

In either of these cases, the power supply terminal Vcc and the reference potential terminal Vo are never short-circuited.

As described above, also in this example of modification, the same effect as that of the embodiment illustrated in FIG. 15 can be obtained.

>Fourth Embodiment (Addition of Clear Function)>

Figure 19:
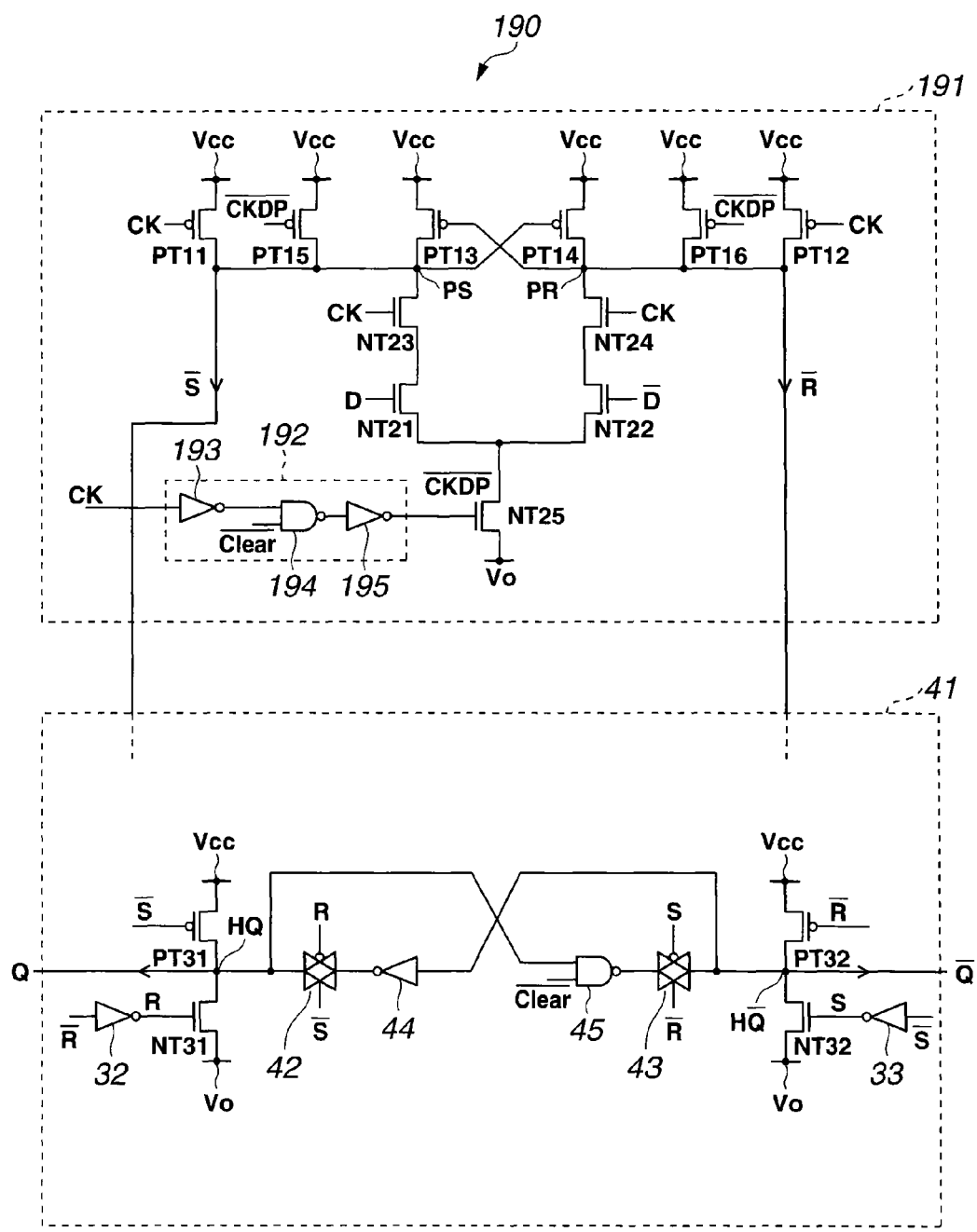
FIG. 19 pertains to a semiconductor integrated circuit device in accordance with the fourth embodiment of the present invention and is a circuit diagram illustrating a flip-flop circuit.

FIG. 19 pertains to a semiconductor integrated circuit device in accordance with the fourth embodiment of the present invention and is a circuit diagram illustrating a flip-flop circuit. In FIG. 19, constituent elements identical to those of FIGS. 2 and 4 are referenced alike and excluded from the description.

In the first embodiment, a configuration is employed wherein a switch 16 for clearing purposes is provided in the state retention node HQ and an AND circuit 14 is used to control data D to be provided to the data input node D. The present embodiment is configured so that the switch 16 for clearing purposes is provided in the state retention node HQ and the clock CK provided to the control node CK is controlled. In addition, an inverted control clock/CKDP, which is described later, is supplied to the gates of the transistors PT15 and PT16.

A flip-flop 190 of the present embodiment is configured with a pulse generator portion 191 and an RS latch portion 41. The pulse generator portion 191 differs from the pulse generator portion 21 shown in FIG. 2 in that the AND circuit 14 shown in FIG. 2 is deleted and a pulse control circuit 192 is employed in place of the delay inverter circuit 22. Note that the pulse control circuit 192 may be configured external to the pulse generator portion 191.

Data D is directly supplied to the gate of the transistor NT21. A clock CK is inputted to the pulse control circuit 192. The pulse control circuit 192 is configured with an inverter 193, a NAND circuit 194 and an inverter 195. The inverter 193 inverts the clock CK inputted thereto and provides the inverted clock CK to one input end of the NAND circuit 194. An inverted clear signal/Clear is inputted to the other input end of the NAND circuit 194. The NAND circuit 194 performs a two-input NAND operation and outputs the result of the operation to the inverter 195. The inverter 195 provides the inverted signal of an inputted signal to the gate of a transistor NT25 as an inverted control clock/CKDP.

When an inverted clear signal/Clear inputted to the NAND circuit 194 is at an H level, the NAND circuit 194 functions as an inverter. Consequently, the pulse control circuit 192 is equivalent to a chain of three inverters. The pulse control circuit 192 delays the inputted clock CK by a delay time caused by the chain of three inverters and invertedly outputs the delayed clock CK. More specifically, when the inverted clear signal/Clear is at an H level, the inverted control clock/CKDP is equivalent to the inverted clock/CKD.

On the other hand, when the inverted clear signal/Clear is at an L level, the output of the NAND circuit 194 goes to an H level. Consequently, the output of the inverter 195 goes to an L level. More specifically, in this case, the inverted control clock/CKDP is at an L level and, therefore, the transistor NT25 turns off.

Next, an explanation will be made of the operation of the embodiment configured as described above.

Now, assume that the inverted clear signal/Clear is at an H level. In this case, the inverted control clock/CKDP equivalent to the inverted clock/CKD is outputted from the pulse control circuit 192. Since data D is directly supplied to the gate of the transistor NT21 when the inverted clear signal/Clear is at an H level in FIG. 2, the pulse generator portion 190 in this case shares the same configuration with the pulse generator portion 21 shown in FIG. 2. Consequently, when the inverted clear signal/Clear is at an H level, a normal flip-flop operation takes place also in the present embodiment.

Here, assume that the inverted clear signal/Clear goes to an L level. In this case, an L-level inverted control clock/CKDP is outputted from the pulse control circuit 192. Consequently, even in a transition period, one and the other discharging paths are forcibly cut off and the pulses/S and/R of the precharge nodes PS and PR maintain themselves at an H level.

On the other hand, since the output of the NAND circuit 45 is fixed to an H level in the RS latch portion 41, the/Q output of the state retention node H/Q goes to an H level and the Q output of the state retention node HQ goes to an L level. In this case, the pulses/S and/R maintain themselves at an H level and, therefore, the transistors PT31 and NT32 are off. Thus, the power supply terminal Vcc and the reference potential terminal Vo are never short-circuited.

As described above, also in the present embodiment, it is possible to clear the Q and/Q outputs without short-circuiting the power supply terminal Vcc and the reference potential terminal Vo, as with the first embodiment.

<First Example of Modification (FF of Single-phase Structure)>

Figure 20:
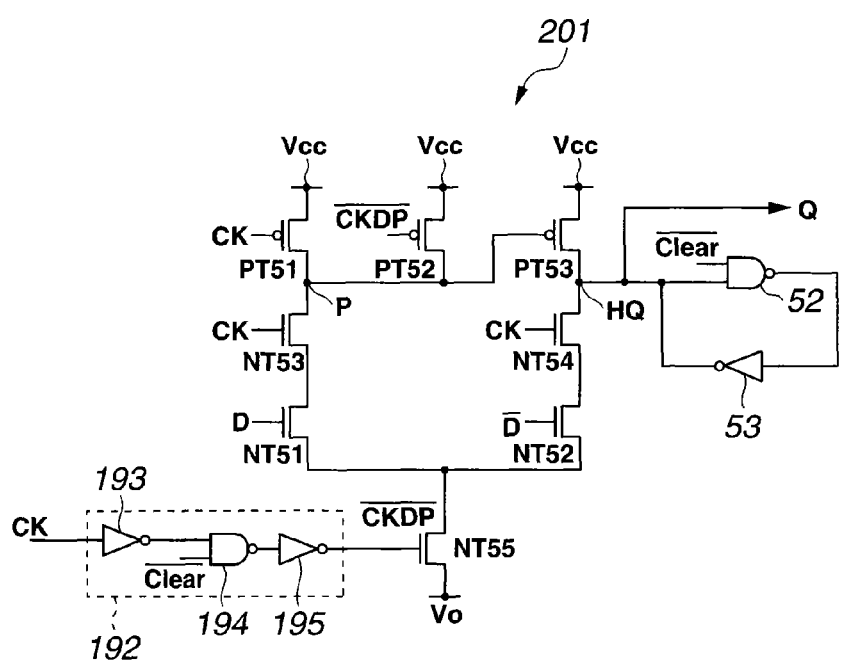
FIG. 20 is a circuit diagram illustrating a flip-flop circuit in accordance with a first example of modification of the fourth embodiment.

FIG. 20 is a circuit diagram illustrating a flip-flop circuit in accordance with a first example of modification.

FIG. 20 illustrates an example wherein an FF of a single-phase structure is employed. In FIG. 20, constituent elements identical to those of FIGS. 5 and 19 are referenced alike and excluded from the description.

A flip-flop 201 illustrated in FIG. 20 differs from the flip-flop 51 illustrated in FIG. 5 in that the AND circuit 14 shown in FIG. 5 is deleted and the pulse control circuit 192 shown in FIG. 19 is employed. Note that an inverted control clock /CKDP is supplied to the gate of a transistor PT52.

The rest of the configuration is the same as that of the flip-flop 51 illustrated in FIG. 5.

In the example of modification configured as described above, when the inverted clear signal/Clear is at an H level, the inverted control clock/CKDP equivalent to the inverted clock/CKD is outputted from the pulse control circuit 192. When the inverted clear signal/Clear is at an H level in FIG. 5, data D is directly supplied to the gate of the transistor NT21. Consequently, in this case, the flip-flop 201 shares the same configuration with the flip-flop 51 illustrated in FIG. 5. Accordingly, when the inverted clear signal/Clear is at an H level, a normal flip-flop operation takes place also in the present embodiment.

Here, assume that the inverted clear signal/Clear goes to an L level. In this case, an L-level inverted control clock/CKDP is outputted from the pulse control circuit 192. Consequently, even in a transition period, the third discharging path is forcibly cut off and the precharge node P maintains itself at an H level. Thus, the transistor PT53 is off in a transition period.

On the other hand, since the output of the NAND circuit 52 is fixed to an H level when the inverted clear signal/Clear goes to an L level, the Q output of the state retention node HQ is fixed to an L level. Even in this case, the transistor PT53 is off and, therefore, the power supply terminal Vcc and the reference potential terminal Vo are never short-circuited.

As described above, the same effect as that of the embodiment illustrated in FIG. 19 is obtained also in this example of modification.

<Second Example of Modification (FF Having No Precharge Nodes)>

Figure 21:
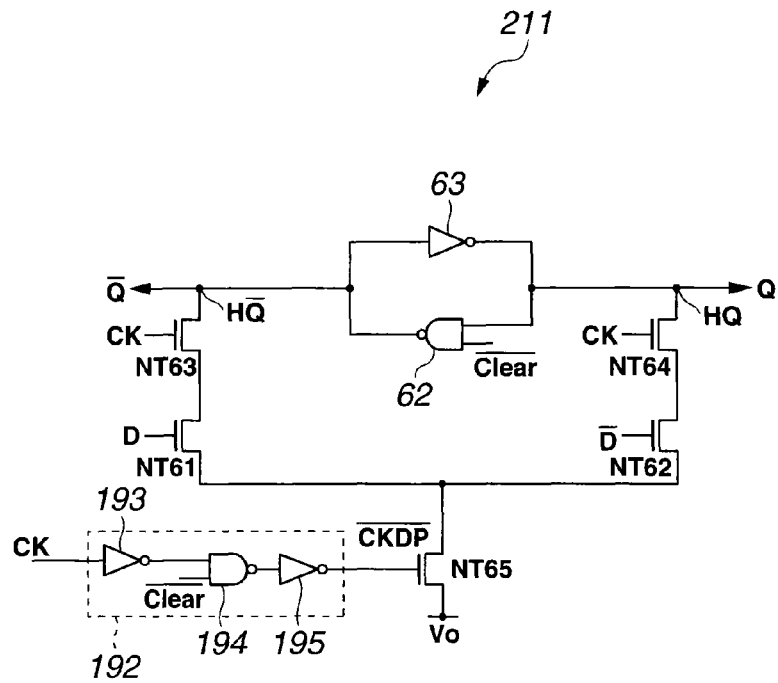
FIG. 21 is a circuit diagram illustrating a flip-flop circuit in accordance with a second example of modification of the fourth embodiment.

FIG. 21 is a circuit diagram illustrating a flip-flop circuit in accordance with a second example of modification.

FIG. 21 illustrates an example wherein an FF having no precharge nodes is employed. In FIG. 21, constituent elements identical to those of FIGS. 6 and 19 are referenced alike and excluded from the description.

A flip-flop 211 illustrated in FIG. 21 differs from the flip-flop 61 illustrated in FIG. 6 in that the AND circuit 14 shown in FIG. 6 is deleted and the pulse control circuit 192 shown in FIG. 19 is employed.

The rest of the configuration is the same as that of the flip-flop 61 illustrated in FIG. 6.

In the example of modification configured as described above, when the inverted clear signal/Clear is at an H level, the inverted control clock/CKDP equivalent to the inverted clock/CKD is outputted from the pulse control circuit 192. When the inverted clear signal/Clear is at an H level in FIG. 6, data D is directly supplied to the gate of the transistor NT21. Consequently, in this case, the flip-flop 211 shares the same configuration with the flip-flop 61 illustrated in FIG. 6. Accordingly, when the inverted clear signal/Clear is at an H level, a normal flip-flop operation takes place also in the present embodiment.

Here, assume that the inverted clear signal/Clear goes to an L level. In this case, an L-level inverted control clock/CKDP is outputted from the pulse control circuit 192. Consequently, even in a transition period, the fifth and sixth discharging paths are forcibly cut off.

On the other hand, since the output of the NAND circuit 62 is fixed to an H level when the inverted clear signal/Clear goes to an L level, the Q output of the state retention node HQ goes to an L level and the/Q output of the state retention node H/Q goes to an H level. Even in this case, the fifth and sixth discharging paths are cut off and, therefore, the power supply terminal Vcc and the reference potential terminal Vo are never short-circuited.

As described above, the same effect as that of the embodiment illustrated in FIG. 19 is obtained also in this example of modification.

<Third Example of Modification (FF Externally Provided with Transition Period Pulse)>

Figure 22:
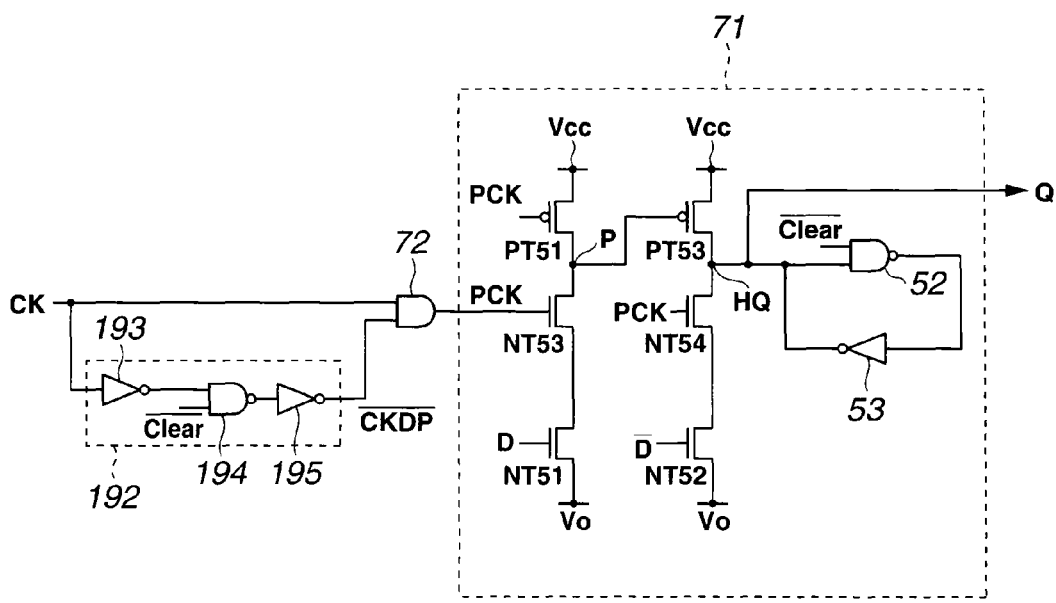
FIG. 22 is a circuit diagram illustrating a flip-flop circuit in accordance with a third example of modification of the fourth embodiment.

FIG. 22 is a circuit diagram illustrating a flip-flop circuit in accordance with a third example of modification.

FIG. 22 illustrates an example wherein an FF externally provided with a transition period pulse is employed. In FIG. 22, constituent elements identical to those of FIGS. 7 and 19 are referenced alike and excluded from the description.

A flip-flop 221 illustrated in FIG. 22 differs from the flip-flop 71 illustrated in FIG. 7 in that the AND circuit 14 shown in FIG. 7 is deleted and the pulse control circuit 192 shown in FIG. 19 is employed in place of the delay inverter circuit 22.

The rest of the configuration is the same as that of the flip-flop 71 illustrated in FIG. 7.

In the example of modification configured as described above, when the inverted clear signal/Clear is at an H level, the inverted control clock/CKDP equivalent to the inverted clock/CKD is outputted from the pulse control circuit 192. When the inverted clear signal/Clear is at an H level in FIG. 7, data D is directly supplied to the gate of the transistor NT21. Consequently, in this case, the flip-flop 221 shares the same configuration with the flip-flop 71 illustrated in FIG. 7. Accordingly, when the inverted clear signal/Clear is at an H level, a normal flip-flop operation takes place also in the present embodiment.

Here, assume that the inverted clear signal/Clear goes to an L level. In this case, an L-level inverted control clock/CKDP is outputted from the pulse control circuit 192. Consequently, even in a transition period, the output of the AND circuit 72 is at an L level and the transistor NT53 is off. Accordingly, even in a transition period, the precharge node P maintains itself at an H level. In other words, the transistor PT53 is off in a transition period.

On the other hand, since the output of the NAND circuit 52 is fixed to an H level when the inverted clear signal/Clear goes to an L level, the Q output of the state retention node HQ goes to an L level. Even in this case, the transistor PT53 is off and, therefore, the power supply terminal Vcc and the reference potential terminal Vo are never short-circuited.

As described above, the same effect as that of the embodiment illustrated in FIG. 19 is obtained also in this example of modification.

<Fourth Example of Modification (Another Example of Pulse Control Circuit)>

Figure 23:
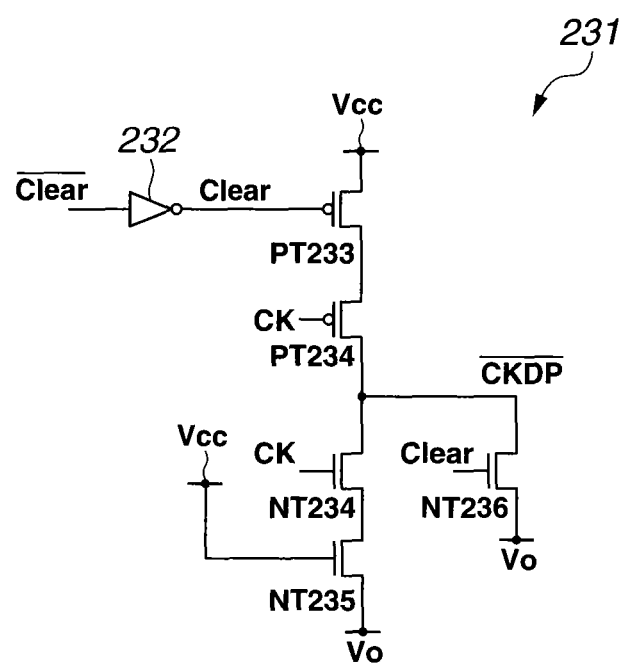
FIG. 23 is a circuit diagram illustrating another example of a pulse control circuit usable in the circuit diagrams of FIGS. 19 to 22.

FIG. 23 is a circuit diagram illustrating another example of a pulse control circuit usable in the circuit diagrams of FIGS. 19 to 22.

A pulse control circuit 231 illustrated in FIG. 23 includes P-type transistors PT233 and PT234 and N-type transistors NT234 to NT236. The source-drain paths of the transistors PT233, PT234, NT234 and NT235 are connected in series between the power supply terminal Vcc and the reference potential terminal Vo.

An inverted clear signal/Clear is provided to an inverter 232 and the inverter 232 supplies a clear signal Clear to the gate of the transistor PT233. An inverted clock signal/CK is supplied to the gate of the transistor PT234 and a clock CK is supplied to the gate of the transistor NT234. A supply voltage Vcc is applied to the gate of the transistor NT235.

The connection point of the transistors PT234 and NT234 is connected to the reference potential terminal Vo through the source-drain path of the transistor NT236. An inverted clear signal/Clear is supplied to the gate of the transistor NT236. Note that the connection point of the transistors PT234 and NT234 serves as the output end of a pulse control circuit 231.

The pulse control circuit 231 configured as describe above is such that when the inverted clear signal/Clear is at an H level, the output of the inverter 232 goes to an L level and, therefore, the transistor PT233 turns on. In addition, the transistor NT236 is off.

In this case, when the clock CK is at an L level, the transistor PT234 turns on and the transistor NT234 turns off, causing the output end to go to an H level.

When the clock CK goes to an H level, the transistor PT234 turns off and the transistor NT234 turns on. Thus, the output end transits to an L level a predetermined time later according to a time constant determined by a parasitic capacitance and the resistive component of the transistors NT234 and NT235. In this way, the output end changes to an L level a predetermined delay time later from the time at which the clock CK goes to an H level. More specifically, the delayed inverted signal of the clock CK appears at the output end.

Note that when the clear signal Clear goes to an H level, the output end is forcibly set to an L level. In this way, the same inverted control clock/CKDP as that provided by the pulse control circuit 192 can also be obtained in the pulse control circuit 231.

According to the above-described configuration, only a fewer number of charging and discharging paths (number of inverters) is required and, therefore, power consumption can be reduced. Another advantage of the configuration is that only a fewer number of transistors is required.

<Fifth Embodiment (Addition of Preset Function)>

Figure 24:
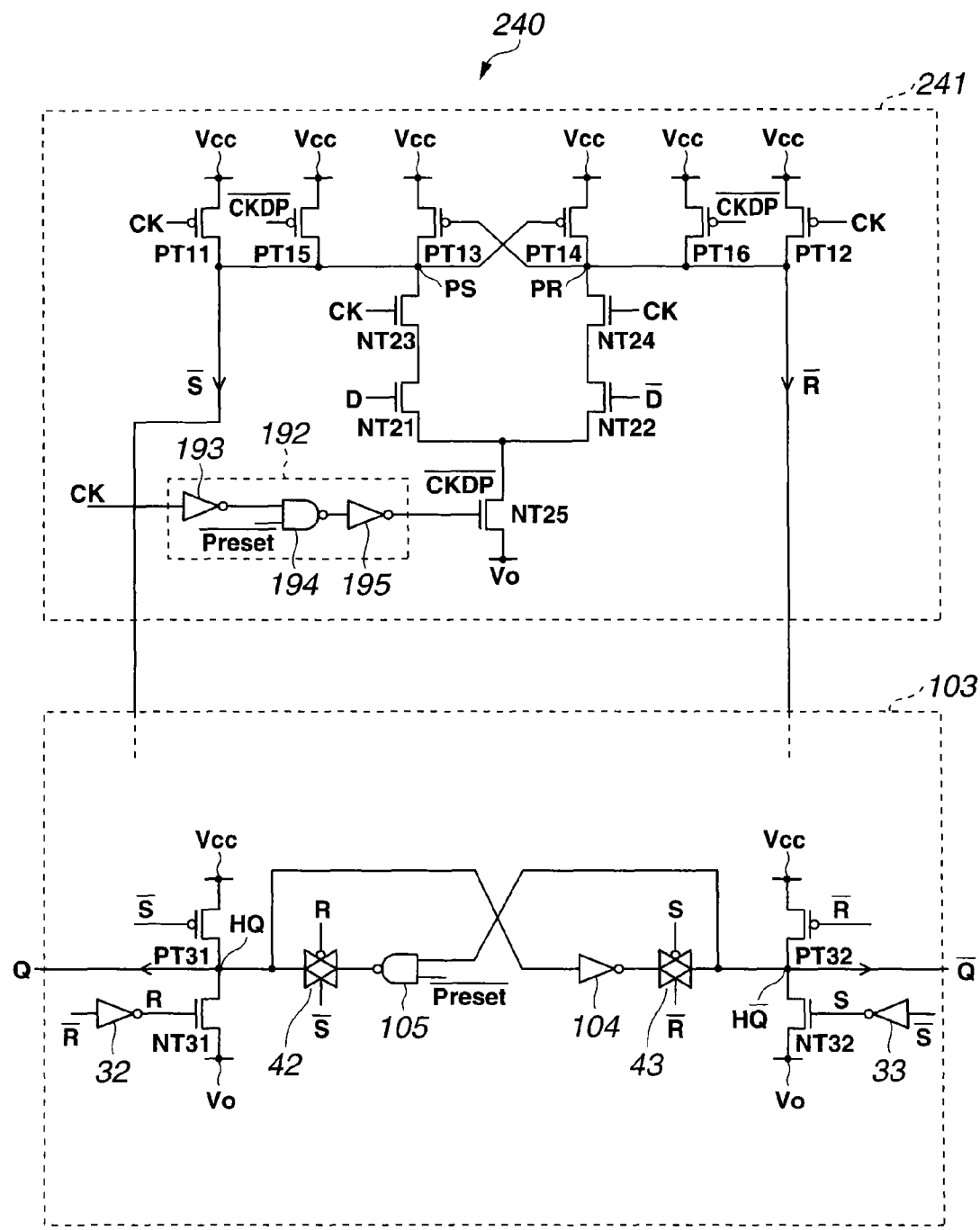
FIG. 24 pertains to a semiconductor integrated circuit device in accordance with the fifth embodiment of the present invention and is a circuit diagram illustrating a flip-flop circuit.

FIG. 24 pertains to a semiconductor integrated circuit device in accordance with the fifth embodiment of the present invention and is a circuit diagram illustrating a flip-flop circuit. In FIG. 24, constituent elements identical to those of FIGS. 10 and 19 are referenced alike and excluded from the description.

A flip-flop 240 of the present embodiment is configured with a pulse generator portion 241 and an RS latch portion 103. The pulse generator portion 241 differs from the pulse generator portion 101 shown in FIG. 10 in that the AND circuit 94 shown in FIG. 10 is deleted and a pulse control circuit 192 is employed in place of the delay inverter circuit 22. Inverted data/D is directly supplied to the gate of the transistor NT22. A clock CK is inputted to the pulse control circuit 192 to generate an inverted control clock/CKDP to be provided to the gate of the transistor NT25.

In the present embodiment, an inverted preset signal/Preset is supplied to the other input end of the NAND circuit 194 in the pulse control circuit 192. When the inverted preset signal/Preset inputted to the NAND circuit 194 is at an H level, the NAND circuit 194 functions as an inverter. Consequently, the pulse control circuit 192 is equivalent to a circuit configured with a chain of three inverters. The pulse control circuit 192 delays the inputted clock CK by a delay time caused by the chain of three inverters and invertedly outputs the delayed clock CK. More specifically, when the inverted preset signal/Preset is at an H level, the inverted control clock /CKDP is equivalent to the inverted clock/CKD.

On the other hand, when the inverted preset signal/Preset is at an L level, the output of the NAND circuit 194 goes to an H level. Consequently, the output of the inverter 195 goes to an L level. More specifically, in this case, the inverted control clock/CKDP is at an L level and, therefore, the transistor NT25 turns off.

Next, an explanation will be made of the operation of the embodiment configured as described above.

Now, assume that the inverted preset signal/Preset is at an H level. In this case, the inverted control clock/CKDP equivalent to the inverted clock/CKD is outputted from the pulse control circuit 192. Since inverted data/D is directly supplied to the gate of the transistor NT22 when the inverted preset signal/Preset is at an H level in FIG. 10, the pulse generator portion 190 in this case shares the same configuration with the pulse generator portion 101 shown in FIG. 10. Consequently, when the inverted preset signal/Preset is at an H level, a normal flip-flop operation takes place also in the present embodiment.

Here, assume that the inverted preset signal/Preset goes to an L level. In this case, an L-level inverted control clock/CKDP is outputted from the pulse control circuit 192. Consequently, even in a transition period, one and the other discharging paths are forcibly cut off and the pulses/S and/R of the precharge nodes PS and PR maintain themselves at an H level.

On the other hand, since the output of the NAND circuit 105 is fixed to an H level in the RS latch portion 103, the Q output of the state retention node HQ goes to an H level and the/Q output of the state retention node H/Q goes to an L level. In this case, the pulses/S and/R maintain themselves at an H level and, therefore, the transistors NT31 and PT32 are off. Thus, the power supply terminal Vcc and the reference potential terminal Vo are never short-circuited.

As described above, also in the present embodiment, it is possible to preset the Q and/Q outputs without short-circuiting the power supply terminal Vcc and the reference potential terminal Vo, as with the second embodiment.

<First to Fourth Examples of Modification>

FIGS. 25 to 28 are circuit diagrams in accordance with first to fourth examples of modification, respectively. The examples of modification illustrated in FIGS. 25 to 27 differ from the examples of modification illustrated in FIGS. 11 to 13 in that control of the discharging path of the precharge node or the state retention node is performed using the pulse control circuit 192 instead of using the AND circuit 94 and the delay inverter circuit 22. Note that an inverted control clock/CKDP is supplied to the gate of a transistor PT52.

Figure 25:
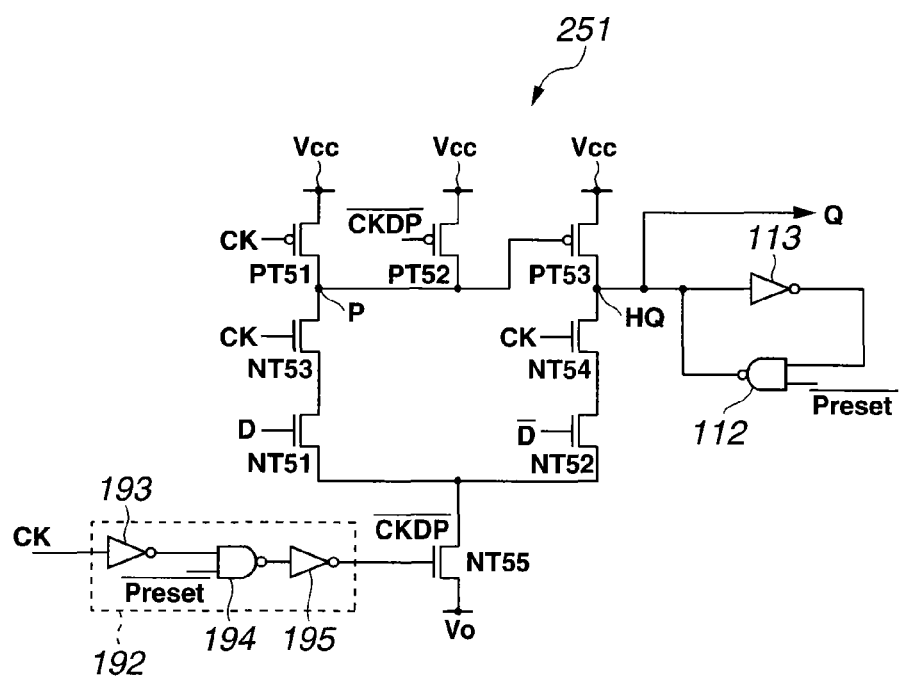
FIG. 25 is a circuit diagram illustrating a flip-flop circuit in accordance with a first example of modification of the fifth embodiment.
Figure 26:
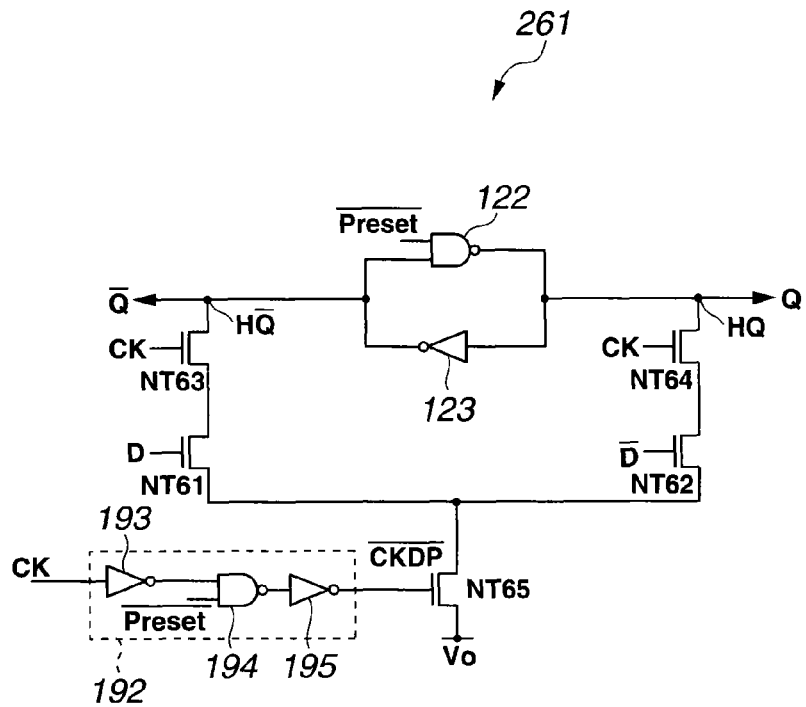
FIG. 26 is a circuit diagram illustrating a flip-flop circuit in accordance with a second example of modification of the fifth embodiment.
Figure 27:
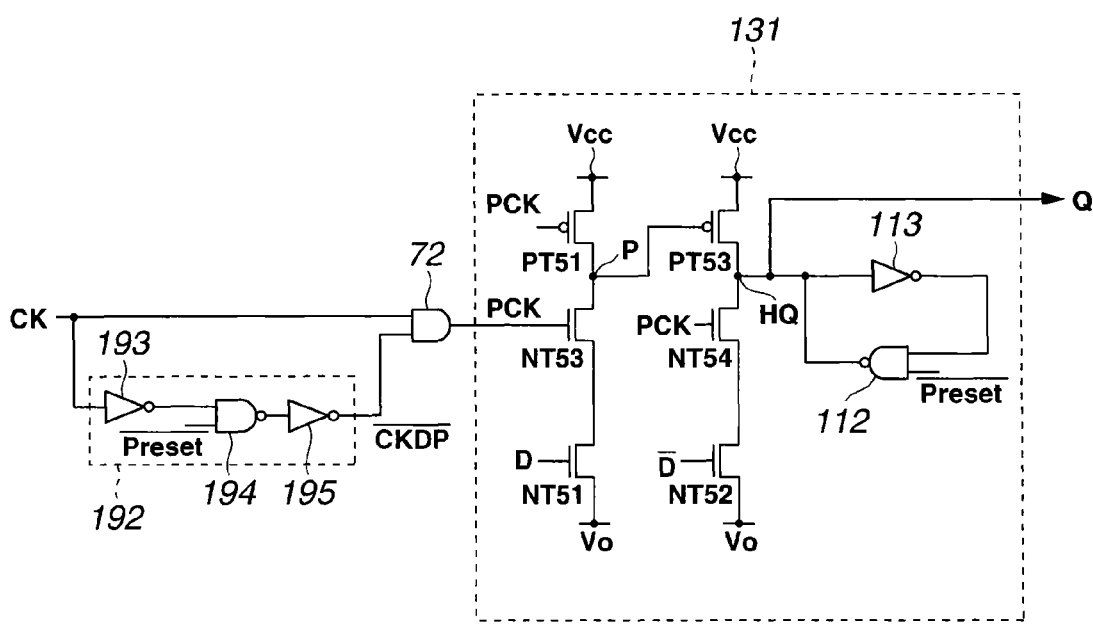
FIG. 27 is a circuit diagram illustrating a flip-flop circuit in accordance with a third example of modification of the fifth embodiment.

A flip-flop 251 illustrated in FIG. 25, a flip-flop 261 illustrated in FIG. 26 and a flip-flop illustrated in FIG. 27 only differ respectively from the flip-flop 111 illustrated in FIG. 11, the flip-flop 121 illustrated in FIG. 12 and the flip-flop illustrated in FIG. 13 in that the AND circuit 94 shown in FIG. 11 is deleted and the pulse control circuit 192 shown in FIG. 24 is employed in place of the delay inverter circuit 22.

As described above, the pulse control circuit 192 outputs the inverted control clock/CKDP same as the inverted clock/CKD when the inverted preset signal /Preset is at an H level.

Consequently, in this case, the flip-flops illustrated in FIGS. 25 to 27 perform a normal flip-flop operation as with the flip-flops illustrated in FIGS. 11 to 13.

In addition, when the inverted preset signal/Preset is at an L level, the pulse control circuit 192 outputs an L-level inverted control clock/CKDP. Accordingly, in this case, the flip-flops illustrated in FIGS. 25 to 27 can perform a preset operation without short-circuiting the power supply terminal Vcc and the reference potential terminal Vo in a transition period, as with the flip-flops illustrated in FIGS. 11 to 13.

Figure 28:
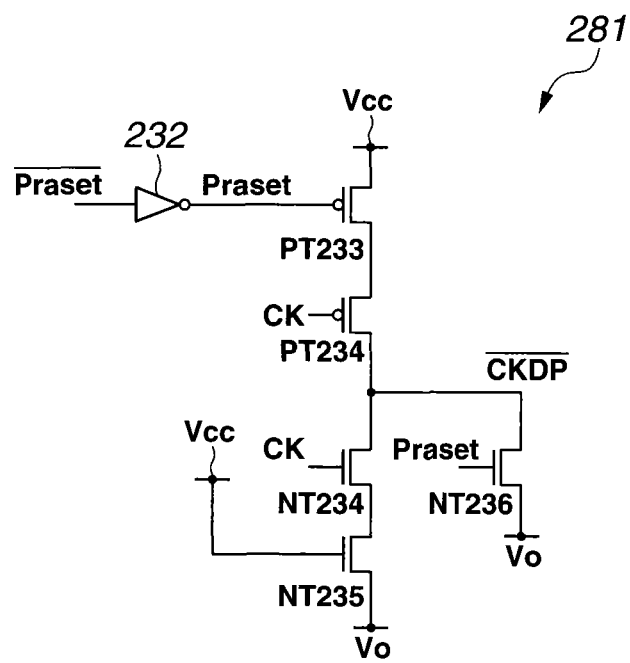
FIG. 28 is a circuit diagram illustrating another example of a pulse control circuit usable in the circuit diagrams of FIGS. 24 to 27.

FIG. 28 is a circuit diagram illustrating another example of a pulse control circuit usable in the circuit diagrams of FIGS. 24 to 27.

A pulse control circuit 281 illustrated in FIG. 28 differs from the pulse control circuit 231 illustrated in FIG. 23 only in that an inverted preset signal/Preset is provided to an inverter 232 and the gate of a transistor NT236.

Consequently, in the pulse control circuit 281 illustrated in FIG. 28, an inverted control clock/CKDP same as the inverted clock/CKD can be obtained using an H-level inverted preset signal/Preset and an L-level inverted control clock /CKDP can be obtained using an L-level inverted preset signal/Preset. In this way, the pulse control circuit 281 illustrated in FIG. 28 can be used in place of the pulse control circuit 192 illustrated in FIGS. 24 to 27.

According to the above-described configuration, only a fewer number of charging and discharging paths (number of inverters) is required and, therefore, power consumption can be reduced. Another advantage of the configuration is that only a fewer number of transistors is required.

<Sixth Embodiment (Addition of Clear and Preset Functions)>

Figure 29:
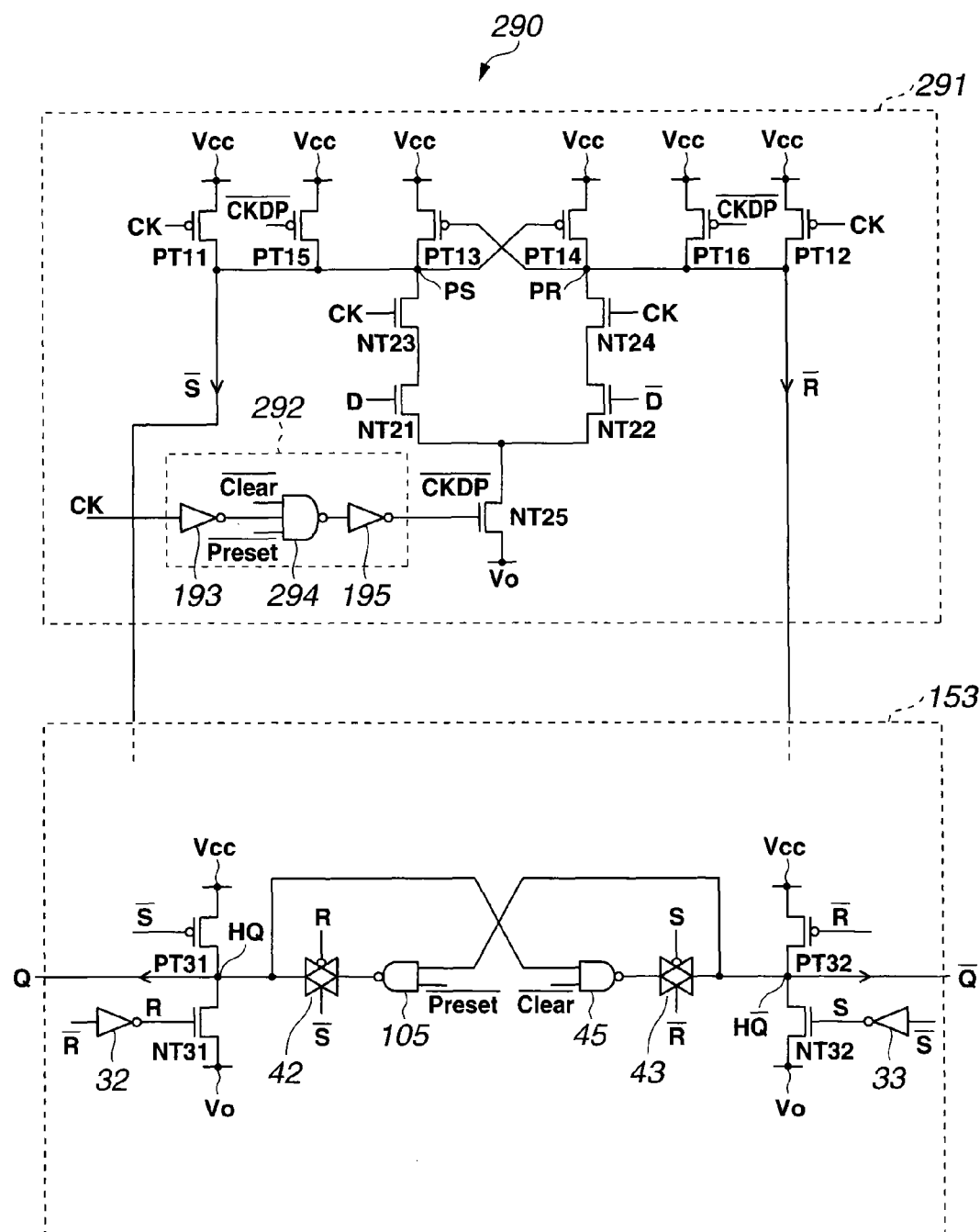
FIG. 29 pertains to a semiconductor integrated circuit device in accordance with the sixth embodiment of the present invention and is a circuit diagram illustrating a flip-flop circuit.

FIG. 29 pertains to a semiconductor integrated circuit device in accordance with the sixth embodiment of the present invention and is a circuit diagram illustrating a flip-flop circuit. In FIG. 29, constituent elements identical to those of FIG. 15 are referenced alike and excluded from the description.

A flip-flop 290 of the present embodiment is configured with a pulse generator portion 291 and an RS latch portion 153. The pulse generator portion 291 differs from the pulse generator portion 151 shown in FIG. 15 in that the AND circuits 14 and 94 shown in FIG. 15 are deleted and a pulse control circuit 292 is employed in place of the delay inverter circuit 22. Note that an inverted control clock/CKDP is supplied to the gate of the transistors PT15 and PT16. Data D and /D are directly supplied to the gates of the transistors NT21 and NT22, respectively. A clock CK is inputted to the pulse control circuit 292 to generate the inverted control clock/CKDP to be provided to the gate of the transistor NT25.

The pulse control circuit 292 differs from the pulse control circuit 192 illustrated in FIG. 19 in that a three-input NAND circuit 294 is used in place of the NAND circuit 194. The output of the inverter 193, an inverted clear signal/Clear, and an inverted preset signal/Preset are provided to the NAND circuit 294. The NAND circuit 294 performs a three-input NAND operation and outputs the result of the operation to the inverter 195.

When both the inverted clear signal/Clear and the inverted preset signal /Preset are at an H level, the NAND circuit 294 functions as an inverter. Consequently, the pulse control circuit 292 is equivalent to a chain of three inverters. The pulse control circuit 292 delays the inputted clock CK by a delay time caused by the chain of three inverters and invertedly outputs the delayed clock CK. More specifically, when the inverted clear signal/Clear and the inverted preset signal /Preset are at an H level, the inverted control clock/CKDP is equivalent to the inverted clock/CKD.

The inverted clear signal/Clear and the inverted preset signal/Preset never go to an L level simultaneously. When the inverted clear signal/Clear is at an L level, the output of the NAND circuit 294 goes to an H level. Thus, the output of the inverter 195 goes to an L level. More specifically, in this case, the inverted control clock/CKDP is at an L level and, therefore, the transistor NT25 turns off. In addition, when the inverted preset signal/Preset is at an L level, the output of the NAND circuit 294 goes to an H level. Consequently, also in this case, the output of the inverter 195 goes to an L level and, therefore, the transistor NT25 turns off.

Next, an explanation will be made of the operation of the embodiment configured as described above.

Now, assume that the inverted clear signal/Clear and the inverted preset signal/Preset are at an H level. In this case, the inverted control clock/CKDP equivalent to the inverted clock/CKD is outputted from the pulse control circuit 292. Since data D and/D are directly supplied to the gates of the transistors NT21 and NT22 when the inverted clear signal/Clear and the inverted preset signal/Preset are at an H level in FIG. 15, the pulse generator portion 190 in this case shares the same configuration with the pulse generator portion 151 shown in FIG. 15. Consequently, when the inverted preset signal/Preset is at an H level, a normal flip-flop operation takes place also in the present embodiment.

Here, assume that either the inverted clear signal/Clear or the inverted preset signal/Preset goes to an L level. In this case, an L-level inverted control clock /CKDP is outputted from the pulse control circuit 292. Consequently, even in a transition period, one and the other discharging paths are forcibly cut off and the pulses/S and/R of the precharge nodes PS and PR maintain themselves at an H level.

Since the output of the NAND circuit 45 is fixed to an H level in the RS latch portion 153 when the inverted clear signal/Clear is at an L level, the/Q output of the state retention node H/Q goes to an H level and the Q output of the state retention node HQ goes to an L level. In this case, the pulses/S and/R maintain themselves at an H level and, therefore, the transistors PT31 and NT32 are off. Thus, the power supply terminal Vcc and the reference potential terminal Vo are never short-circuited.

Conversely, when the inverted preset signal/Preset goes to an L level, the output of the NAND circuit 105 is fixed to an H level. Consequently, the Q output of the state retention node HQ goes to an H level and the/Q output of the state retention node H/Q goes to an L level. In this case, the pulses/S and/R maintain themselves at an H level and, therefore, the transistors NT31 and PT32 are off. Thus, the power supply terminal Vcc and the reference potential terminal Vo are never short-circuited.

As described above, the Q and/Q outputs can be cleared when the inverted clear signal/Clear is at an L level and the Q and/Q outputs can be preset when the inverted preset signal/Preset is at an L level. In this case, the power supply terminal Vcc and the reference potential terminal Vo are never caused to short-circuit with each other in the present embodiment, as with the fourth and fifth embodiments.

<First to Fourth Examples of Modification>

FIGS. 30 to 33 are circuit diagrams illustrating flip-flop circuits in accordance with first to fourth examples of modification, respectively. The examples of modification illustrated in FIGS. 30 to 32 differ from the examples of modification illustrated in FIGS. 16 to 18 only in that control of the discharging path of the precharge node or the state retention node is performed using the pulse control circuit 292 instead of using the AND circuits 14 and 94 and the delay inverter circuit 22.

Figure 30:
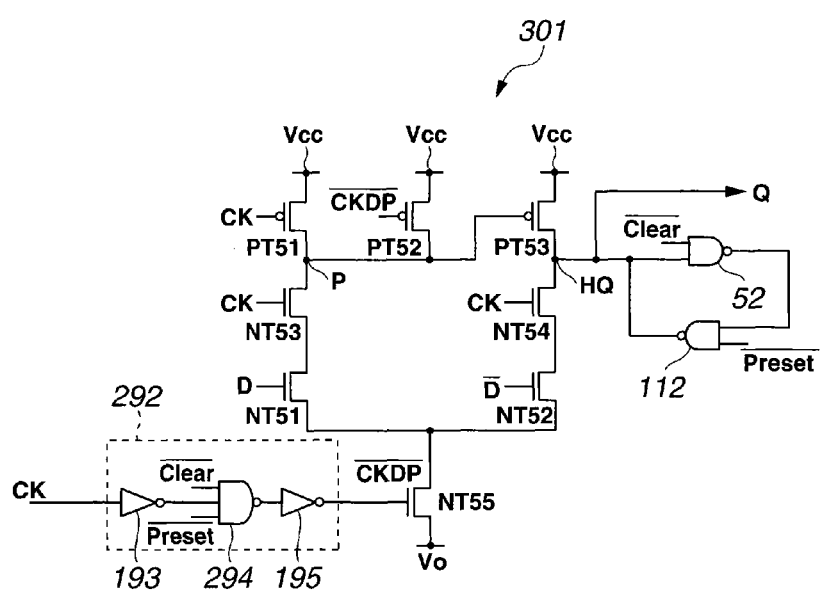
FIG. 30 is a circuit diagram illustrating a flip-flop circuit in accordance with a first example of modification of the sixth embodiment.
Figure 31:
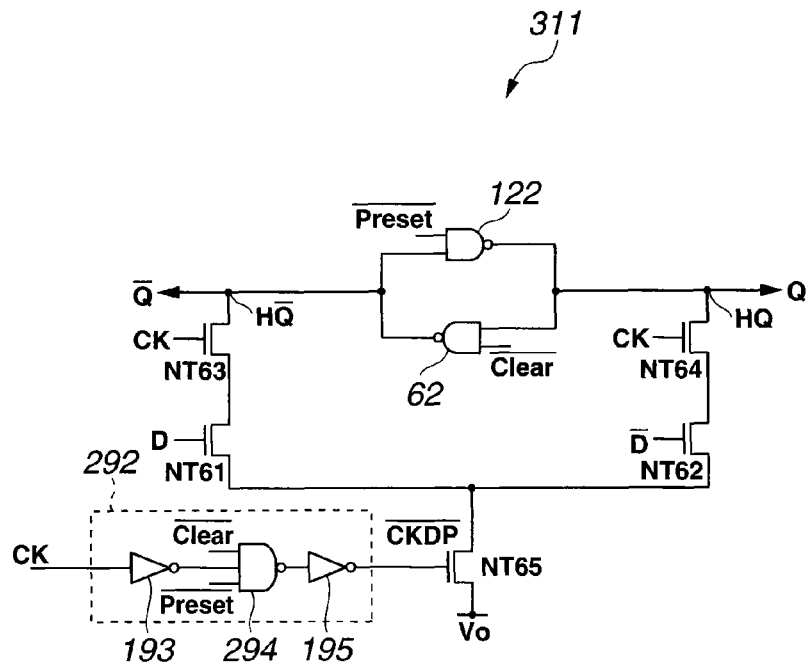
FIG. 31 is a circuit diagram illustrating a flip-flop circuit in accordance with a second example of modification of the sixth embodiment.
Figure 32:
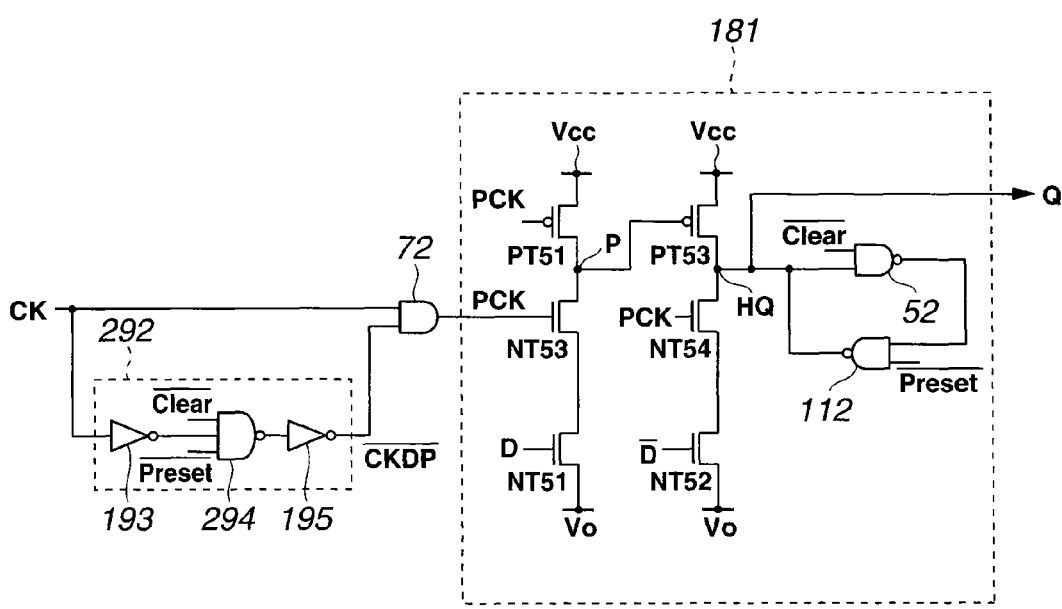
FIG. 32 is a circuit diagram illustrating a flip-flop circuit in accordance with a third example of modification of the sixth embodiment.

A flip-flop 301 illustrated in FIG. 30, a flip-flop 311 illustrated in FIG. 31 and a flip-flop illustrated in FIG. 32 differ respectively from the flip-flop 161 illustrated in FIG. 16, the flip-flop 171 illustrated in FIG. 17 and the flip-flop illustrated in FIG. 18 in that the AND circuits 14 and 94 shown in FIG. 16 are deleted and the pulse control circuit 292 shown in FIG. 29 is employed in place of the delay inverter circuit 22. Note that an inverted control clock/CKDP is supplied to the gate of the transistor PT52.

As described above, the pulse control circuit 292 outputs the inverted control clock/CKDP same as the inverted clock/CKD when the inverted clear signal/Clear and the inverted preset signal/Preset are at an H level.

Consequently, in this case, the flip-flops illustrated in FIGS. 30 to 32 perform a normal flip-flop operation, as with the flip-flops illustrated in FIGS. 16 to 18.

In addition, when the inverted clear signal/Clear or the inverted preset signal /Preset is at an L level, the pulse control circuit 292 outputs an L-level inverted control clock/CKDP. Accordingly, in this case, the flip-flops illustrated in FIGS. 30 to 32 can perform a preset operation without short-circuiting the power supply terminal Vcc and the reference potential terminal Vo in a transition period, as with the flip-flops illustrated in FIGS. 16 to 18.

Figure 33:
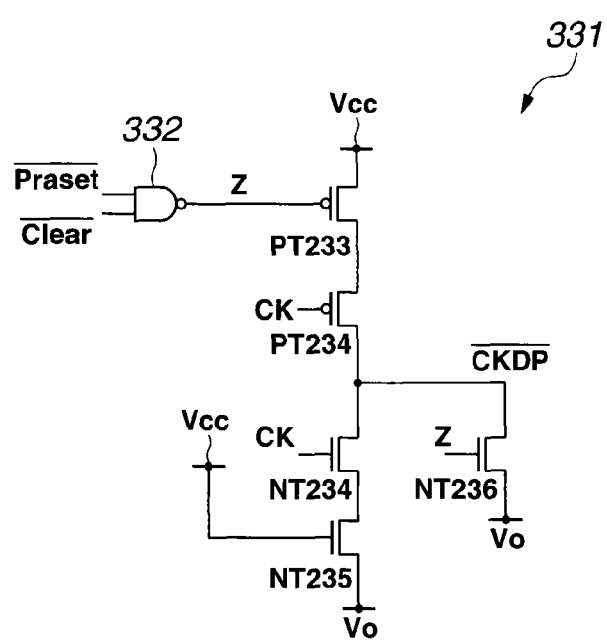
FIG. 33 is a circuit diagram illustrating another example of a pulse control circuit usable in the circuit diagrams of FIGS. 29 to 32.

FIG. 33 is a circuit diagram illustrating another example of a pulse control circuit usable in the circuit diagrams of FIGS. 29 to 32.

A pulse control circuit 331 illustrated in FIG. 33 is such that a NAND circuit 332 is employed in place of the inverter 232 in the pulse control circuit illustrated in FIG. 23 or 28. An inverted clear signal/Clear and an inverted preset signal/Preset are provided to the NAND circuit 332. The NAND circuit 332 provides the result of a two-input NAND operation to the gate of a transistor PT233 as a signal Z. The signal Z is also provided to the gate of a transistor NT236.

In the pulse control circuit 331 configured as described above, when the inverted clear signal/Clear and the inverted preset signal/Preset are at an H level, the output of the NAND circuit 332 goes to an L level and, therefore, the transistor PT233 turns on. In addition, the transistor NT236 is off.

When the clock CK is at an L level in this case, the transistor PT234 is on and the transistor NT234 is off, causing the output end to go to an H level.

When the clock CK goes to an H level, the transistor PT234 turns off and the transistor NT234 turns on. Thus, the output end transits to an L level a predetermined time later according to a time constant determined by a parasitic capacitance and the resistive component of the transistors NT234 and NT235. In this way, the output end changes to an L level a predetermined delay time later from the time at which the clock CK goes to an H level. More specifically, the delayed inverted signal of the clock CK appears at the output end.

Note that either the clear signal Clear or the preset signal Preset goes to an H level (i.e., the signal Z goes to an H level), the output end is forcibly set to an L level.

In this way, the same inverted control clock/CKDP as that of the pulse control circuit 292 can be obtained also in the pulse control circuit 331.

According to the above-described configuration, only a fewer number of charging and discharging paths (number of inverters) is required and, therefore, power consumption can be reduced. Another advantage of the configuration is that only a fewer number of transistors is required.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A semiconductor integrated circuit device comprising:
 a first charging circuit connected between a first power supply and a first node and configured to charge the first node based on a first signal and a second signal generated by delaying and inverting the first signal;
 a second charging circuit connected between the first power supply and a second node and configured to charge the second node based on the first signal and the second signal;
 a first discharging path connected between the first node and a third node, and including a first switching circuit configured to be turned on and off according to the first signal, and a second switching circuit connected in series to the first switching circuit and configured to be turned on and off according to a fifth signal obtained by an operation of a third signal and a fourth signal;
 a second discharging path connected between the second node and the third node, and including a third switching circuit configured to be turned on and off according to the first signal and a fourth switching circuit connected in series to the third switching circuit and configured to be turned on and off according to a sixth signal generated by inverting the third signal; and
 a fifth switching circuit connected between the third node and a second power supply and configured to be turned on and off according to the second signal.

2. The semiconductor integrated circuit device according to claim 1, wherein the first signal is a clock signal having a predetermined cycle, the fourth signal is a clear signal representing a clear period, and the fifth signal is a signal obtained by a logical AND of the third signal and the fourth signal.

3. The semiconductor integrated circuit device according to claim 1, wherein the first charging circuit is configured by first and second transistors, the second charging circuit is configured by third and fourth transistors, and the first to fifth switching circuits are configured by fifth to ninth transistors, respectively,
 wherein:
 the first transistor includes a source to which a first supply voltage is inputted, a gate to which the first signal is inputted, and a drain to which the first node is connected;

the second transistor includes a source to which the first supply voltage is inputted, a gate to which the second signal is inputted, and a drain to which the first node is connected, the third transistor includes a source to which the first supply voltage is inputted, a gate to which the first signal is inputted, and a drain to which the second node is connected;

the fourth transistor includes a source to which the first supply voltage is inputted, a gate to which the second signal is inputted, and a drain to which the second node is connected;

the fifth transistor includes a drain to which the first node is connected, and a gate to which the first signal is inputted;

the sixth transistor includes a drain to which a source of the fifth transistor is connected, a gate to which the fifth signal obtained by the logical operation of the third signal and the fourth signal is inputted, and a source to which the third node is connected;

the seventh transistor includes a drain to which the second node is connected, and a gate to which the first signal is inputted;

the eighth transistor includes a drain to which a source of the seventh transistor is connected, a gate to which the sixth signal generated by inverting the third signal is inputted, and a source to which the third node is connected; and the ninth transistor includes a drain to which the third node is connected, a gate to which the second signal is inputted, and a source to which a second supply voltage is inputted.

4. The semiconductor integrated circuit device according to claim 3, wherein the first signal is a clock signal having a predetermined cycle, the fourth signal is a clear signal representing a clear period, and the fifth signal is a signal obtained by a logical AND of the third signal and the fourth signal.

5. A semiconductor integrated circuit device comprising:
a first charging circuit connected between a first power supply and a first node, and configured to charge the first node based on a first signal and a third signal obtained by operation of a signal generated by delaying the first signal and a second signal;
a second charging circuit connected between the first power supply and a second node, and configured to charge the second node based on the first signal and the third signal;
a first discharging path connected between the first node and a third node, and including a first switching circuit configured to be turned on and off according to the first signal and a second switching circuit connected in series to the first switching circuit and configured to be turned on and off according to a fourth signal;
a second discharging path connected between the second node and the third node and including a third switching circuit configured to be turned on and off according to the first signal and a fourth switching circuit connected in series to the second switching circuit and configured to be turned on and off according to a fifth signal generated by inverting the fourth signal; and
a fifth switching circuit connected between the third node and a second power supply and configured to be turned on and off according to the third signal.

6. The semiconductor integrated circuit device according to claim 5, wherein the first signal is a clock signal having a predetermined cycle, the second signal is a clear signal representing a clear period, and the third signal is a signal obtained by a logical AND of the signal generated by delaying the first signal and the second signal.

7. The semiconductor integrated circuit device according to claim 5, wherein the first signal is a clock signal having a predetermined cycle, the second signal is a preset signal representing a preset period, and the third signal is a signal obtained by a logical AND of the signal generated by delaying the first signal and the second signal.

8. The semiconductor integrated circuit device according to claim 5, wherein the first charging circuit is configured by first and second transistors, the second charging circuit is configured by third and fourth transistors, and the first to fifth switching circuits are configured by fifth to ninth transistors, respectively, wherein:
the first transistor includes a source to which a first supply voltage is inputted, a gate to which the first signal is inputted, and a drain to which the first node is connected;

the second transistor includes a source to which the first supply voltage is inputted, a gate to which the third signal obtained by the operation of the signal generated by delaying the first signal and the second signal is inputted, and a drain to which the first node is connected;

the third transistor includes a source to which the first supply voltage is inputted, a gate to which the first signal is inputted, and a drain to which the second node is connected;

the fourth transistor includes a source to which the first supply voltage is inputted, a gate to which the third signal is inputted, and a drain to which the second node is connected;

the fifth transistor includes a drain to which the first node is connected, and a gate to which the first signal is inputted, the sixth transistor includes a drain to which a source of the fifth transistor is connected, a gate to which the fourth signal is inputted, and a source to which the third node is connected;

the seventh transistor includes a drain to which the second node is connected, and a gate to which the first signal is inputted;

the eighth transistor includes a drain to which a source of the seventh transistor is connected, a gate to which the fifth signal generated by inverting the fourth signal is inputted, and a source to which the third node is connected; and the ninth transistor includes a drain to which the third node is connected, a gate to which the third signal is inputted, and a source to which a second supply voltage is inputted.

9. The semiconductor integrated circuit device according to claim 8, wherein the first signal is a clock signal having a predetermined cycle, the second signal is a clear signal representing a clear period, and the third signal is a signal obtained by a logical AND of the signal generated by delaying the first signal and the second signal.

10. The semiconductor integrated circuit device according to claim 8, wherein the first signal is a clock signal having a predetermined cycle, the second signal is a preset signal representing a preset period, and the third signal is a signal obtained by a logical AND of the signal generated by delaying the first signal and the second signal.

11. A semiconductor integrated circuit device comprising:
a first charging circuit connected between a first power supply and a first node, and configured to charge the first node based on a first signal and a fourth signal obtained by an operation of a signal generated by delaying the first signal, a second signal, and a third signal;

a second charging circuit connected between the first power supply and a second node, and configured to charge the second node based on the first signal and the fourth signal;

a first discharging path connected between the first node and a third node and including a first switching circuit configured to be turned on and off according to the first signal and a second switching circuit connected in series to the first switching circuit and configured to be turned on and off according to a fifth signal;

a second discharging path connected between the second node and the third node and including a third switching circuit configured to be turned on and off according to the first signal and a fourth switching circuit connected in series to the third switching circuit and configured to be turned on and off according to a sixth signal generated by inverting the fifth signal; and a fifth switching circuit connected between the third node and a second power supply and configured to be turned on and off according to the fourth signal.

12. The semiconductor integrated circuit device according to claim 11, wherein the first signal is a clock signal having a predetermined cycle, the second signal is a clear signal representing a clear period, the third signal is a preset signal representing a preset period, and the fourth signal is a signal obtained by a logical AND of the signal generated by delaying the first signal, the second signal, and the third signal.

13. The semiconductor integrated circuit device according to claim 11, wherein the first charging circuit is configured by first and second transistors, the second charging circuit is configured by third and fourth transistors, and the first to fifth switching circuits are configured by fifth to ninth transistors, respectively, wherein:

the first transistor includes a source to which a first supply voltage is inputted, a gate to which the first signal is inputted, and a drain to which the first node is connected;

the second transistor includes a source to which the first supply voltage is inputted, a gate to which the fourth signal obtained by the operation of the signal generated by delaying the first signal, the second signal and the third signal is inputted, and a drain to which the first node is connected;

the third transistor includes a source to which the first supply voltage is inputted, a gate to which the first signal is inputted, and a drain to which the second node is connected;

the fourth transistor includes a source to which the first supply voltage is inputted, a gate to which the fourth signal is inputted, and a drain to which the second node is connected;

the fifth transistor includes a drain to which the first node is connected, and a gate to which the first signal is inputted;

the sixth transistor includes a drain to which a source of the fifth transistor is connected, a gate to which the fifth signal is inputted, and a source to which the third node is connected;

the seventh transistor includes a drain to which the second node is connected, and a gate to which the first signal is inputted; and the eighth transistor includes a drain to which a source of the seventh transistor is connected, a gate to which the sixth signal generated by inverting the fifth signal is inputted, and a source to which the third node is connected; and the ninth transistor includes a drain to which the third node is connected, a gate to which the fourth signal is inputted, and a source to which a second supply voltage is inputted.

14. The semiconductor integrated circuit device according to claim 13, wherein the first signal is a clock signal having a predetermined cycle, the second signal is a clear signal representing a clear period, the third signal is a preset signal representing a preset period, and the fourth signal is a signal obtained by a logical AND of the signal generated by delaying the first signal, the second signal, and the third signal.

* * * * *